United States Patent [19]

Lear

[11] Patent Number: 5,633,527
[45] Date of Patent: May 27, 1997

[54] UNITARY LENS SEMICONDUCTOR DEVICE

[75] Inventor: Kevin L. Lear, Albuquerque, N.M.

[73] Assignee: Sandia Corporation, Albuquerque, N.M.

[21] Appl. No.: 384,089

[22] Filed: Feb. 6, 1995

[51] Int. Cl.[6] .................. H01L 29/205; H01L 27/142; G02B 6/42; H01S 3/19
[52] U.S. Cl. ............ 257/432; 257/98; 257/101; 257/184; 257/191; 372/44; 372/50; 372/101
[58] Field of Search .................. 257/432, 98, 101, 257/191, 184; 372/44, 50, 101

[56] References Cited

U.S. PATENT DOCUMENTS

| | | | |
|---|---|---|---|
| 3,763,372 | 10/1973 | Fedotowsky | 250/211 J |
| 3,981,023 | 9/1976 | King | 357/17 |
| 4,025,157 | 5/1977 | Martin | 350/96 C |
| 4,108,622 | 8/1978 | Martin | 65/30 R |
| 4,339,689 | 7/1982 | Yamanaka | 313/499 |
| 4,956,000 | 9/1990 | Reeber | 65/18.1 |
| 5,073,041 | 12/1991 | Rastani | 372/101 |
| 5,126,875 | 6/1992 | Tabuchi | 257/432 |
| 5,181,220 | 1/1993 | Yagi | 372/45 |
| 5,223,049 | 6/1993 | Paoli | 372/44 |
| 5,262,360 | 11/1993 | Holonyak | 437/237 |
| 5,359,618 | 10/1994 | Lebby | 372/45 |
| 5,493,577 | 2/1996 | Choquette et al. | 372/45 |

FOREIGN PATENT DOCUMENTS

| | | | |
|---|---|---|---|
| 3-85774 | 4/1991 | Japan | 257/98 |
| 5-6988 | 1/1993 | Japan | 257/98 |

OTHER PUBLICATIONS

J.M. Dallesasse and N. Holonyak, Jr., "Native–Oxide Stripe–Geometry $Al_xGa_{1-x}As$–GaAs Quantum–Well Heterostructure Lasers," *Applied Physics Letters*, vol. 58, pp. 394–396, Jan. 28, 1991.

D. L. Huffaker, D. G. Deppe, and K. Kumar, "Native–Oxide Defined Ring Contact for Low Threshold Vertical–Cavity Lasers," *Applied Physics Letters*, vol. 65, pp. 97–99, Jul. 4, 1994.

M. J. Ries, T. A. Richard, S. A. Maranowski, N. Holonyak, Jr., and E. I. Chen, "Photopumped Room–Temperature Edge–and Vertical–Cavity Operation of AlGaAs–GaAs–InGaAs Quantum–Well Heterostructure Lasers Utilizing Native Oxide Mirrors," *Applied Physics Letters*, vol. 65, pp. 740–742, Aug. 8, 1994.

M. H. MacDougal, H. Zhao, P. D. Dapkus, M. Zari, and W. H. Steier, "Wide–Bandwidth Distributed Bragg Reflectors Using Oxide/GaAs Multilayers," *Electronics Letters*, vol. 30, pp. 1147–1149, Jul. 7, 1994.

D. L. Huffaker, D. G. Deppe, and T. J. Rogers, "Transverse Mode Behavior in Native–Oxide–Defined Low Threshold Vertical–Cavity Lasers," *Applied Physics Letters*, vol. 65, pp. 1611–1613, Sep. 26, 1994.

D. L. Huffaker, J. Shin, H. Deng, C. C. Lin, D. G. Deppe, and B. G. Streetman, "Improved Mode Stability in Low Threshold Single Quantum Well Native–Oxide Defined Vertical–Cavity Lasers," *Applied Physics Letters*, vol. 65, pp. 2642–2644, Nov. 21, 1994.

D. L. Huffaker, J. Shin, and D. G. Deppe, "Low Threshold Half–Wave Vertical–Cavity Lasers," *Electronics Letters*, vol. 30, pp. 1946–1947, Nov. 10, 1994.

K. D. Choquette, R. P. Schneider, Jr., K. L. Lear, and K. M. Geib, "Low Threshold Voltage Vertical–Cavity Lasers Fabricated by Selective Oxidation," *Electronics Letters*, vol. 30, pp. 2043–2044, Nov. 24, 1994.

*Primary Examiner*—Jerome Jackson
*Attorney, Agent, or Firm*—John P. Hohimer

[57] ABSTRACT

A unitary lens semiconductor device and method. The unitary lens semiconductor device is provided with at least one semiconductor layer having a composition varying in the growth direction for unitarily forming one or more lenses in the semiconductor layer. Unitary lens semiconductor devices may be formed as light-processing devices such as microlenses, and as light-active devices such as light-emitting diodes, photodetectors, resonant-cavity light-emitting diodes, vertical-cavity surface-emitting lasers, and resonant cavity photodetectors.

50 Claims, 9 Drawing Sheets

UNITARY LENS SEMICONDUCTOR DEVICE

This invention was made with Government support under Contract No. DE-AC04-94AL85000 awarded by the U.S. Department of Energy. The Government has certain rights in the invention.

FIELD OF THE INVENTION

The present invention relates generally to a semiconductor device having at least one unitary lens formed therein, and in particular to a light-processing or light-active device. The present invention has applications for forming microlenses, vertical-cavity surface-emitting lasers, light-emitting diodes, and photodetectors either singly or in arrays with unitary lenses for redirecting light rays therein. A method for making such a unitary lens semiconductor device is also described.

BACKGROUND OF THE INVENTION

The monolithic integration of lenses with photoelectric elements is desirable for redirecting light rays within the elements to concentrate light therein or to provide more efficient light coupling therefore. Integrated lenses may also be useful for improving the coupling of light from photoelectric elements to optical fibers.

U.S. Pat. No. 3,763,372 to Fedotowsky et al discloses a device having zone plate optics monolithically integrated with a phase filter and a photoelectric element to provide an image conforming to the shape of the photoelectric element after multiple reflections of a light beam within the device.

U.S. Pat. No. 3,981,023 to King et al discloses a light emitting diode structure formed on a substrate and having one or more convex lenses extending into an aperture through the substrate.

U.S. Pat. No. 4,339,689 to Yamanaka et al discloses a light emitting diode having a protrusion formed unitarily on a surface of a semiconductor clad layer for facing an input end of a light guide to effect light coupling therewith. The method for forming the light emitting diode includes the step of selectively etching the substrate to form a through-hole to expose at least the protrusion of the clad layer.

U.S. Pat. Nos. 5,038,354 and 5,181,220 to Yagi disclose a semiconductor light emitting and light concentrating device having a multiple diffraction ring system for collecting and focusing the light emitted from a semiconductor light emitting element of the device.

U.S. Pat. Nos. 4,025,157 and 4,108,622 to Martin disclose a miniature optical lens that is a composite material shaped in a configuration of pairs of parallel rectangular side surfaces, each such pair of surfaces being disposed orthogonally relative to each other pair. The composition of the semiconductor material of the miniature optical lens varies between at least one pair of the parallel rectangular flat surfaces for causing a predetermined gradient of refraction of the order of approximately one percent between the surfaces, thereby producing a desired focal length for wavelengths of light energy transmitted orthogonal to the gradient index of refraction (i.e. parallel to the surfaces).

U.S. Pat. No. 4,956,000 to Reeber discloses a method for fabricating a gradient lens by a spatially non-uniform deposition process, with the lens material being directed through an orifice of a rotating lens-shaping element, and the lens size and shape determined by the selective direction and condensation of vaporized lens material onto a substrate.

The unitary lens semiconductor device of the present invention represents an improvement over prior art devices, and has an advantage that one or more unitary lenses may be formed adjacent to and self-aligned with a light-active region for the generation or detection of light, while providing in some embodiments a planar outer surface for the device.

Another advantage of the unitary lens semiconductor device according to the present invention is that the vertical placement of one or more unitary lenses may be determined relative to a substrate, light-active region, or other optical or electronic element during growth of epitaxial layers upon a semiconductor substrate, with the unitary lenses later formed either adjacent to an outer surface of the device, or buried more deeply within the device (as, for example, below a stack mirror, or adjacent to a light-active region).

A further advantage of the present invention is that the position and shape of the unitary lens may be defined in part by a composition of one or more semiconductor layers during growth of the layers.

Another advantage of the present invention is that the unitary lens may be located within a resonant cavity formed by a pair of stack mirrors to provide means for defining a lateral mode for the light generated within the device.

Yet another advantage of the present invention is that the unitary lens may define a light-active area of a light-active region in a unitary lens semiconductor device, thereby providing for an accurate self-alignment of the lens and light-active area with a common optical axis.

Still another advantage of the present invention is that the unitary lens may be electrically conducting and provide a current channel for the flow of an electrical current into or out from a light-active region of the device.

Another advantage of the unitary lens semiconductor device according to the present invention is that an efficiency for coupling light rays into or out from the device may be improved by the unitary lens formed adjacent to a light-active region in the device.

These and other advantages of the unitary lens semiconductor devices and method of the present invention will become evident to those skilled in the art.

SUMMARY OF THE INVENTION

Accordingly, it is a primary object of the present invention to provide a unitary lens semiconductor device and method which overcomes the drawbacks of the prior art.

An additional object of the present invention is to provide a unitary lens semiconductor device having one or more unitary lenses therein defined and formed by semiconductor processes including epitaxial growth of one or more semiconductor layers on a substrate, thereby reducing manufacturing costs and allowing large numbers of unitary lens semiconductor devices to be fabricated simultaneously.

A further object of the present invention is to provide a unitary lens semiconductor device in which one or more lenses may be formed unitarily with and aligned to a light-active region, thereby forming a light-active device such as a light-emitting diode, a vertical-cavity surface-emitting laser, or a photodetector.

Another object of the present invention is to provide a unitary lens semiconductor device comprising one or more unitary lenses formed upon or attached to a substrate for focusing, defocusing, collimating, or imaging light rays.

Still another object of the present invention is to provide a unitary lens semiconductor device wherein a light-active region within the device generates a beam of light, and a unitary lens adjacent to the light-active region redirects light rays of the beam for a free-space transmission thereof, or for focusing the light beam at a focal point.

Another object of the present invention is to provide a unitary lens semiconductor device wherein a unitary lens acts to define a light-active area within the device by channeling a flow of electrical current into the light-active region.

A further object of the invention is to improve an efficiency for light generation or light detection in a light-active unitary lens semiconductor device by providing a unitary lens therein to redirect light rays more nearly along an optical axis.

Yet another object of the present invention is to provide a plurality of unitary lenses in the form of a one-dimensional or a two-dimensional array.

Another object of the present invention is to provide a light-active unitary lens semiconductor device having a unitary lens formed within a resonant cavity to provide a means for control of a lateral mode of light generated therein.

A further object of the present invention is to provide a unitary lens that may be formed coextensively with a stack mirror in a resonant cavity light-active device such as a resonant-cavity light-emitting diode, a vertical-cavity surface-emitting laser, or a resonant cavity photodetector.

Additional objects, advantages, and novel features of the present invention will become evident to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, a unitary lens semiconductor device and method is provided which, according to a first embodiment of the invention, includes a transparent substrate having at least one semiconductor layer thereon, the semiconductor layer having a semiconductor composition varying in a direction normal to an upper surface of the substrate; and a lower-refractive-index portion formed in at least one of the semiconductor layers and extending downward therein to an extent varying in at least one direction parallel to the upper surface of the substrate thereby forming a unitary lens for redirecting light rays.

According to a second embodiment of the present invention, the unitary lens may be located within a mesa formed within at least one semiconductor layer on a transparent substrate, the semiconductor layer having a composition varying in a direction normal to an upper surface of the substrate; and the mesa having at least one sidewall wherefrom a lower-refractive-index portion of the semiconductor layer extends laterally inward to an extent varying in a direction normal to the upper surface of the substrate.

According to a third embodiment of the present invention, a unitary lens semiconductor device may be provided with a plurality of semiconductor layers grown upon a substrate, the semiconductor layers comprising a light-active region and a lens-forming region adjacent to the light-active region, and electrodes above and below a semiconductor junction in the light-active region for electrically activating the light-active region. In the third embodiment of the present invention at least one unitary lens is formed in the lens-forming region adjacent to the light-active region for redirecting light rays into or out from the light-active region. Light-active devices formed according to the third embodiment of the present invention may be provided with the unitary lens and light-active region both located above an upper surface of the substrate; or the unitary lens and light-active region may be located on opposite surfaces of the substrate. Examples of light-active devices formed according to the third embodiment of the present invention include light-emitting diodes and photodetectors. When the third embodiment of the present invention also comprises a resonant cavity encompassing the light-active region, vertical-cavity surface-emitting lasers, resonant-cavity light-emitting diodes, and resonant-cavity photodetectors may be formed, for example.

In accordance with the present invention, the light-active region may include one or more quantum-well layers sandwiched between cladding layers.

Also in accordance with the present invention one or two dimensional arrays of unitary lenses may be formed in the unitary lens semiconductor device, with the lenses formed above a substrate or adjacent to a light-active region on a substrate.

Other objects, advantages, and novel features of the present invention will become apparent from the following detailed description when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings am only for the purpose of illustrating a preferred embodiment of the invention and are not to be construed as limiting the invention. In the drawings.

DETAILED DESCRIPTION OF THE INVENTION

The present invention may be best described by considering a series of examples of a unitary lens semiconductor device 10 formed according to the present invention as shown in FIGS. 1–9 and described in detail hereinafter.

Figure 1:
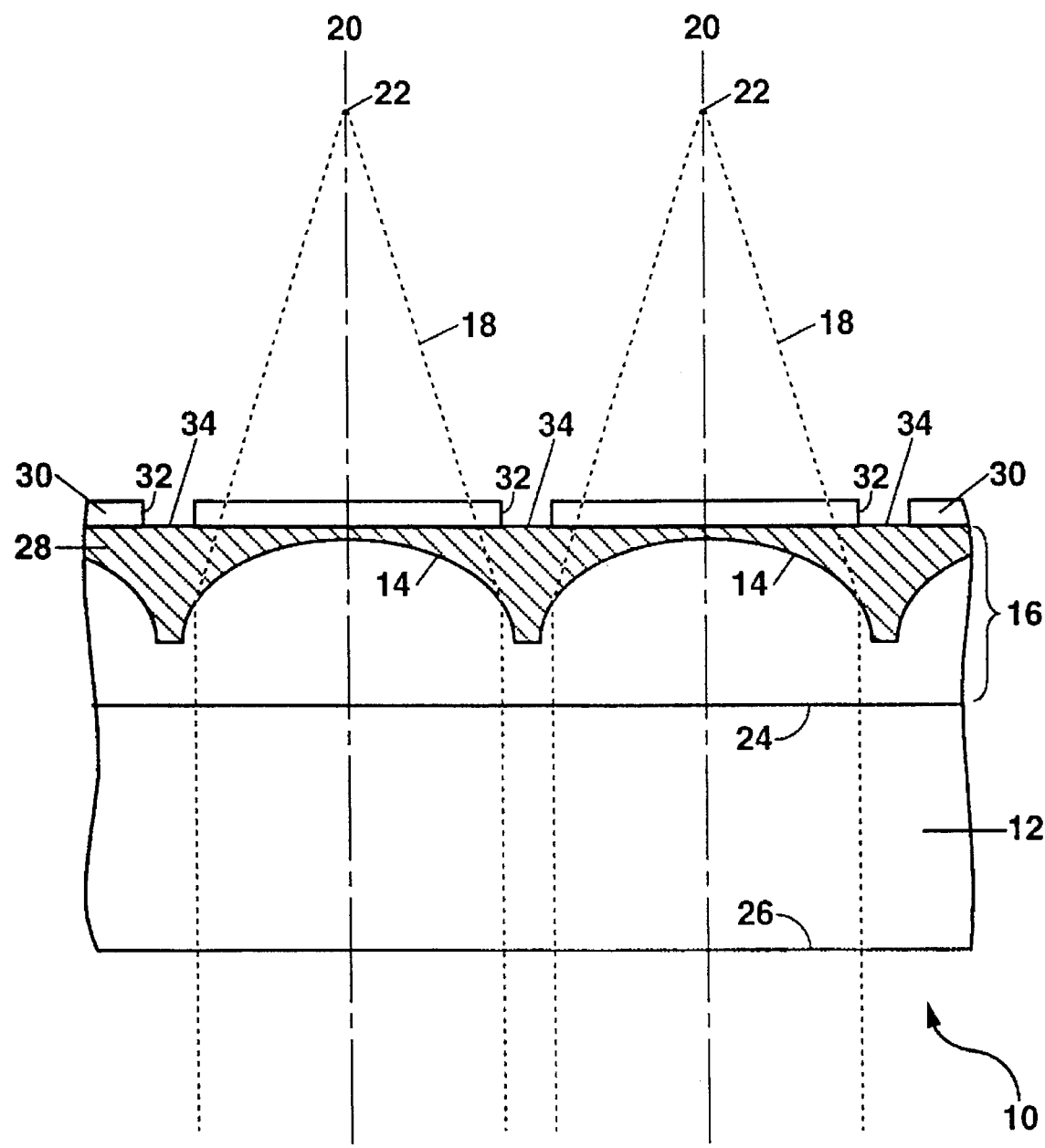
FIG. 1 shows a greatly enlarged cross-section representation of a first example of a unitary lens semiconductor device according to a first embodiment of the present invention.

Referring to FIG. 1, there is shown a schematic representation of a first example of a unitary lens semiconductor device 10 according to a first embodiment of the invention. In FIG. 1, the unitary lens semiconductor device 10 comprises on a substrate 12 at least one unitary lens 14 formed in one or more semiconductor layers 16 above the substrate.

According to the first embodiment of the present invention, the substrate 12 is formed from a material transparent to optical radiation (transparent is defined herein as being substantially transmissive to optical radiation over a range of wavelengths, preferably in a portion of the visible or near-infrared regions of the spectrum). Furthermore, according to the first embodiment of the invention one or more unitary lenses 14 may be formed above the substrate for receiving one or more light beams 18 (i.e. a beam of light rays) and redirecting the light beams along an optical axis 20 substantially normal to the substrate 12 to process the light rays by focusing the rays of the beam 18 at a focal point 22 as shown in FIG. 1, or by defocusing, collimating, or imaging the light rays.

According to a second embodiment of the present invention, a unitary lens semiconductor device may be formed having at least one mesa defined in the semiconductor layer 16 for formation of a unitary lens 14 by means of a chemical reaction process proceeding laterally inward from at least one sidewall 36 of the mesa. The unitary lens semiconductor device 10 according to the second embodiment of the present invention may be used to process light rays in a light beam 18 in a manner similar to the first embodiment of the present invention.

According to a third embodiment of the present invention, the unitary lens semiconductor device 10 is preferably a light-active device having a plurality of semiconductor layers grown on a substrate and forming a light-active region 42 and a lens-forming region 44 adjacent to the light-active region. Devices 10 formed according to the third embodiment of the present invention may be used for generating or detecting one or more light beams 18. In some examples of the third embodiment of the present invention, the light beam 18 need not be transmitted through the substrate 12, thereby allowing the use of a substrate that is substantially opaque, or only partially transmissive to the light beam.

According to the first embodiment of the present invention, the substrate 12 may be a transparent semiconductor substrate or wafer upon which the semiconductor layer 16 is grown by an epitaxial growth process such as molecular beam epitaxy (MBE), metal-organic chemical vapor deposition (MOCVD), liquid phase epitaxy (LPE) or the like. Alternately, the semiconductor layer 16 may be grown upon a semiconductor growth substrate that is not transparent at a wavelength range of use of the device 10. In this case, the semiconductor layer 16 may be attached to a transparent substrate 12 either before or after formation of the unitary lens semiconductor device 10 (for example, the semiconductor layer 16 may be attached at the outer surface 34 thereof to the transparent substrate 12 with or without a ram oval of the growth substrate from the layer 16). In this latter case, the transparent substrate 12 may be formed of a glassy or crystalline material (for example a transparent semiconductor material, a glass, plastic, epoxy resin, silicon dioxide, sapphire, diamond, or any other transparent material), with the form of attachment being an adhesive, a solder, or a covalent bond (i.e. a so-called "van der Waals" bond) formed between the layer 16 and the substrate 12.

As a first example of the first embodiment of the present invention, a unitary lens semiconductor device 10 in the form of a plurality of unitary lenses 14 forming a one- or two-dimensional array for use in the wavelength range from about 600 to about 900 nanometers may be provided by growing an aluminum gallium arsenide (AlGaAs) semiconductor layer 16 upon a gallium arsenide (GaAs) growth substrate and processing the semiconductor layer to form the device 10. Since the GaAs substrate is not substantially transparent over the above specified wavelength range of use, the semiconductor layer 16 may be removed from the GaAs growth substrate after formation of the lenses 14 by either mechanical polishing, or preferential etching, or both to remove the growth substrate. The AlGaAs semiconductor layer 16 may then be attached to a transparent substrate 12 as shown in FIG. I for support and processing of one or more light beams 18 received by the device 10.

Semiconductor substrates 12 according to the first embodiment of the present invention may include silicon, and binary or ternary compound semiconductors such as III-V and II-VI compound semiconductors, with a particular substrate having a preferred range for light transmission at wavelengths longer than an energy bandgap wavelength of the semiconductor or semiconductor alloy comprising the substrate 12. A semiconductor substrate 12 may be either doped with an impurity dopant species (i.e. an n-type or p-type dopant species); or the substrate 12 may be undoped (i.e. semi-insulating). For other embodiments of the present invention in which the unitary lens semiconductor device 10 is a light-active device such as a light-emitting diode, vertical-cavity surface-emitting laser, or a photodetector, the semiconductor substrate 12 is preferably gallium arsenide (GaAs), indium phosphide (InP), or gallium phosphide (GAP); and the substrate may be doped, for example, n-type with Si ($\geq 1\times10^{18}$ cm$^{-3}$) to allow a flow of an electrical current therein.

Figure 2:
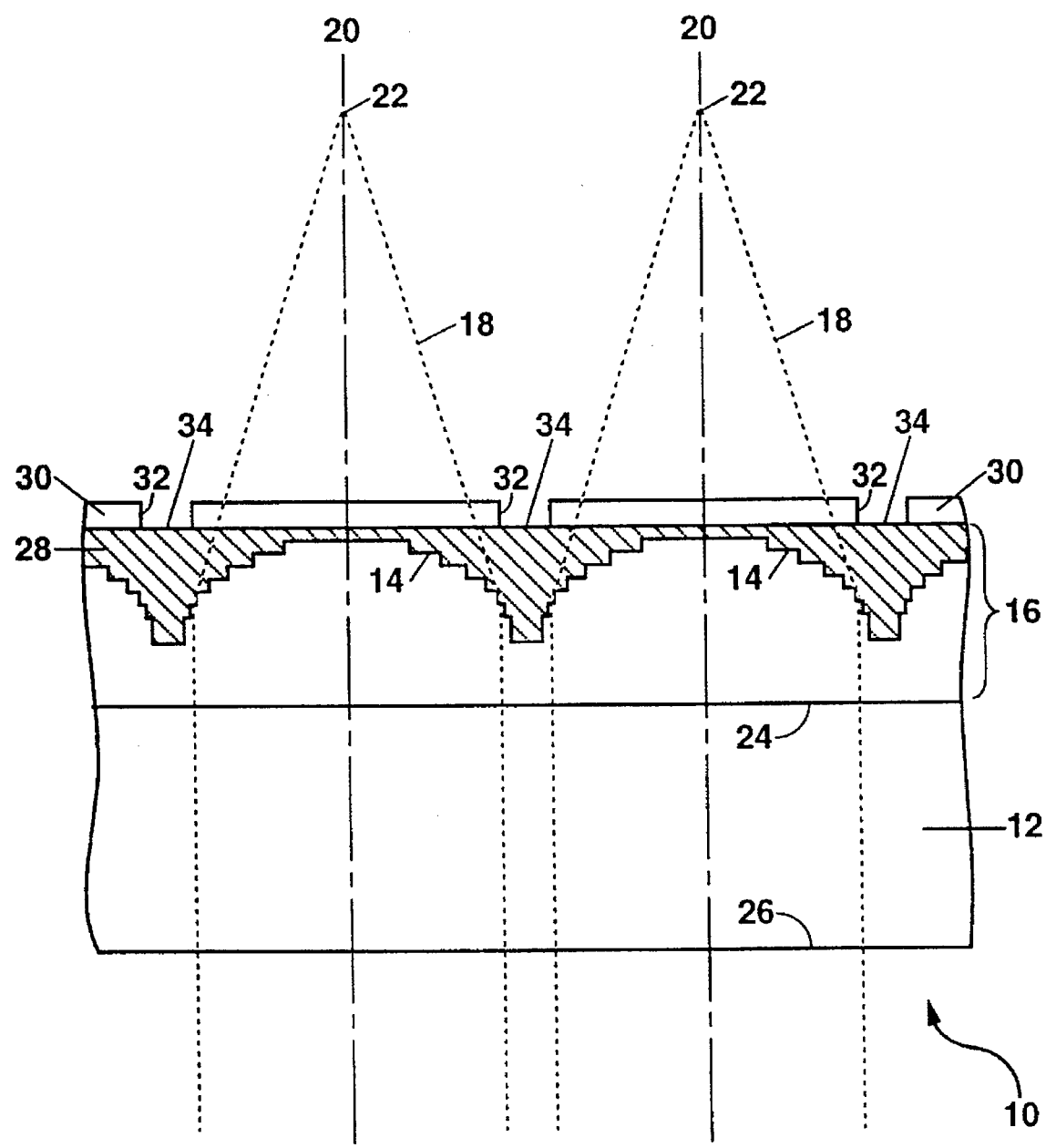
FIG. 2 shows a cross-section representation of a second example of a unitary lens semiconductor device according to a first embodiment of the present invention.

According to the first embodiment of the present invention, at least one semiconductor layer 16 is grown upon or attached to the substrate 12. The semiconductor layer 16 comprises a semiconductor having an composition (composition is defined herein as an alloy composition, or an impurity dopant composition, or both of a semiconductor material) that varies either continuously or in discrete compositional steps in the growth direction (i.e. in a direction normal to an upper surface 24 of the substrate 12 upon which the semiconductor layer 16 is grown or attached). The use of a continuously varying composition may be used to form a unitary lens 14 having a smooth lens curvature as shown in FIG. 1; whereas the use of a stepped (i.e. discretely varying) composition may be used to form a unitary lens 14 having a stepped or staircase shape as shown in FIG. 2.

The semiconductor layer 16 is preferably formed from an aluminum alloy that includes at least one element selected from the group consisting of As, Ga, In, and P. For example, the semiconductor alloy may be AlGaAs, AlGaInP, AlGaAsP, or InAlGaAs. A particular semiconductor alloy to he used in practicing the present invention may be selected based upon the desired wavelength range for use of the unitary lens semiconductor device 10, and the transmissivity of the semiconductor layer 16 over this wavelength range.

A lower-refractive-index portion 28 of the semiconductor layer 16 (defined herein as a portion 28 in which the refractive index is smaller than that of the as-grown semiconductor alloy in the layer 16) is formed by a chemical alteration or conversion of the as-grown semiconductor alloy by a chemical reaction process. In an aluminum alloy semiconductor layer 16, for example, the lower-refractiveindex portion 28 may be formed by converting a portion or region of the aluminum alloy to an oxide of aluminum by a selective oxidation process as described hereinafter. The oxide of aluminum comprising the lower-refractive-index portion 28 may have a refractive index, n, of about 1.6 as compared to n≈2.9 or higher for an as-grown AlGaAs semiconductor layer 16. By controlling the progression of the chemical reaction process, the lower-refractive-index portion 28 may be shaped both laterally (i.e. in a direction parallel to an upper surface 24 of the substrate 12) and vertically (i.e. in a direction normal to the upper surface of the substrate) to form one or more lenses 14 unitarily as shown in FIGS. 1–9.

The selective oxidation process for one or more aluminum alloy semiconductor layers 16 is preferably carried out by placing the semiconductor layers 16 (at this point preferably still attached to the growth substrate) into a container and heating the layers to a temperature of about 350° to 500° C. (and preferably between about 400° and 450° C. for AlGaAs semiconductor layers) under a controlled environment having a high humidity for a time period of up to several hours. Such a moist environment may be generated, for example, by flowing or bubbling a gas, such as nitrogen, through water heated to about 80°–95° C. to entrain water vapor, and then directing the moisture-laden gas into the container.

In an $Al_xGa_{1-x}As$ semiconductor layer 16, for example, the rate of chemical reaction (i.e. oxidation) of the AlGaAs to an oxide of aluminum is strongly dependent on the aluminum composition, x, in the alloy, especially for x in the range of about 0.8 to 1.0. Furthermore, the oxidation rate is extremely small for $x \leq 0.3$; and a GaAs layer (i.e. x=0) remains substantially unaltered by the selective oxidation process.

Measurements of the selective oxidation rate of $Al_xGa_{1-x}As$ semiconductor layers 16 at 425° C. normalized to the selective oxidation rate of AlAs (i.e. x=1.0) show the selective oxidation rate for x=1.0 (i.e. AlAs) to be about two orders of magnitude larger than for x=0.84 (i.e. $Al_{0.84}Ga_{0.16}As$), and about one order of magnitude larger than for x=0.96 (i.e. $Al_{0.96}Ga_{0.04}As$). Thus by varying the aluminum alloy composition of the semiconductor layer 16 during growth, the selective oxidation rate may be controlled and varied across the layer 16.

The selective oxidation rate of an $Al_xGa_{1-x}As$ semiconductor layer 16 is also expected to be controllable and variable to a lesser extent by controlling a dopant type and a dopant concentration (i.e. a dopant composition) of the layer; with the selective oxidation rate of an $Al_{0.96}Ga_{0.04}As$ semiconductor layer 16 expected to be slightly higher for a p-type dopant composition than for an n-type dopant composition. Furthermore, the selective oxidation rate of a p-doped $Al_{0.96}Ga_{0.04}As$ semiconductor layer 16 is expected to increase with the dopant concentration; whereas the selective oxidation rate of an n-doped $Al_{0.96}Ga_{0.04}As$ semiconductor layer 16 is expected to decrease with the dopant concentration. Thus, the dopant composition may be varied during growth of the semiconductor layer 16 to provide a means for controlling and varying the rate of selective oxidation of the layer 16.

According to the teaching of the present invention the semiconductor alloy composition may be varied with either a fixed or variable dopant composition for the formation of one or more unitary lenses 14; or the semiconductor alloy composition may be fixed, with a variable dopant composition.

In forming one or more unitary lenses 14 within the semiconductor layer 16, the size and shape of the lower-refractive-index portion 28 may be further defined by a mask layer 30 formed above the semiconductor layer 16. The mask layer 30 may be formed during growth (for example, by growing a GaAs mask layer 30 above an AlGaAs semiconductor layer 16); or the mask layer 30 may be deposited after growth, but prior to the chemical reaction process for formation of the lower-refractive-index portion. In the case of a mask layer 30 deposited after growth, the mask layer may be a photoresist layer, an insulating layer (for example, silicon nitride or silicon dioxide), a metal layer, or a layer of any other material that is substantially impervious to the chemical reaction process for forming the lower-refractive-index portion 28 of the semiconductor layer 16.

Figure 3:
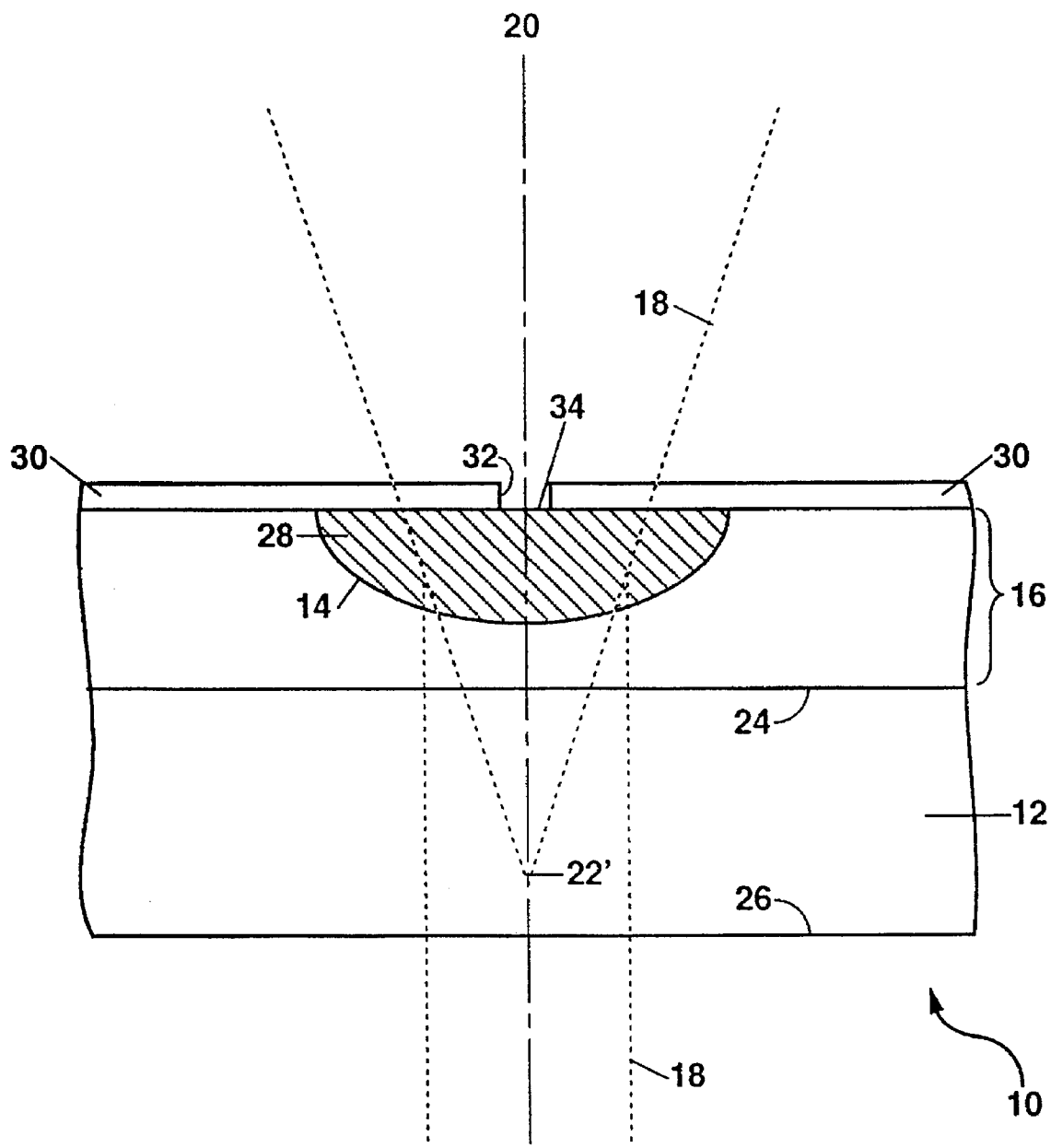
FIG. 3 shows a cross-section representation of a third example of a unitary lens semiconductor device according to a first embodiment of the present invention.

The mask layer 30 may be lithographically patterned by an etching or lift-off step to provide one or more access regions 32 to an outer surface 34 of the semiconductor layer 16. The access regions 32 (i.e. openings through the mask layer 30) may be sized and shaped to define the underlying unitary lens 14. For example, in FIG. I the access regions 32 may be in the form of rectangular trenches extending downward to the outer surface 34 to define one or more positive cylindrical lenses 14; or the access regions 32 may be one or more trenches, annular or square in shape (when viewed along the optical axis 20), to define one or more positive circular lenses 14. In the example of FIG. 3, a single circular access region 32 centered about the optical axis 20 may be used to form a negative circular lens 14; or a single rectangular trench access region 32 centered about the optical axis 20 may be used to form a negative cylindrical lens 14. According to the teaching of the present invention, one or more unitary lenses 14 of any shape may be formed by an appropriate shaping of the access regions 32, including both positive and negative unitary lenses 14 on the same substrate 12.

To form a positive unitary lens 14 within the device 10, the effective optical pathlength (defined herein as the pathlength, L, multiplied by the refractive index, n) of the light rays traversing the semiconductor layer 16 in a direction normal to the upper surface 24 of the substrate 12 must be longer for rays propagating along the optical axis 20 (i.e. on-axis rays) than for rays propagating at a distance away from the optical axis (i.e. on-axis rays). Similarly, to form a negative unitary lens 14, the effective optical pathlength of the light rays traversing the semiconductor layer 16 must be shorter for on-axis rays than for off-axis rays.

The mask layer 30 in combination with the variation in the composition (i.e. the alloy composition, dopant composition, or both) of the semiconductor layer 16 provide a means for defining a downward extent of the lower-refractive-index portion 28 into the semiconductor layer 16 and a variation in the downward extent in at least one lateral direction parallel to the upper surface 24 of the substrate 12 as shown in FIG. 1. In the example given heretofore of an $Al_xGa_{1-x}As$ semiconductor layer 16, the access regions 32 as shown in FIG. 1 provide a starting point for the selective oxidation of the semiconductor layer 16. If the aluminum alloy composition, x, in the $Al_xGa_{1-x}As$ semiconductor layer 16 is increased during growth to a high value at the outer surface 34, then the selective oxidation process will proceed from the access regions 32 where moisture-laden gas is brought into contact with the semiconductor layer 16. The conversion of the $Al_xGa_{1-x}As$ to an oxide of aluminum will then occur at a faster rate near the outer surface 34 where the aluminum alloy composition is highest, and at a reduced rate away from the outer surface where the aluminum alloy composition is lower and further removed from the outer surface 34. In this manner, the downward extent of the aluminum oxide lower-refractive-index portion 28 formed by the selective oxidation process may be varied laterally away from the access regions 32. This lateral variation of the selective oxidation process may proceed from a rectangular (as viewed along the optical axis 20) trench access region 32 to form a cylindrical unitary lens 14; or from a circular or square shaped trench access region to form a spherical unitary lens; or from an elliptical or rectangular shaped trench access region to form an anamorphic unitary lens 14. In this example, the size (i.e. the lateral dimensions) and shape of the unitary lenses 14 may be determined by the location and shape of the access regions 32, and the curvature (resulting in a focal length and the local point 22) of the lenses 14 may be determined by the variation in the semiconductor alloy composition (and/or the dopant composition) of the semiconductor layer 16 during growth, the area of the outer surface 34 exposed by the access regions 32, and the temperature and time for the selective oxidation process.

After formation of the unitary lenses 14, the mask layer 30 in FIG. 1 may be removed to provide a planar outer surface 34 for the unitary lens semiconductor device 10. The lower-refractive-index portion 28 of the semiconductor layer 16 acts to reduce the reflection of light at the outer surface 34 as compared to lenses formed entirely of a semiconductor. The reflectivity of the outer surface 34 and a lower surface 26 of the substrate 12 may be further reduced by the application of anti-reflection coatings thereon as known to the art.

The types of unitary lenses 14 that may be formed in the unitary lens semiconductor device 10 according to the teaching of the present invention include cylindrical lenses, spherical lenses, and anamorphic lenses. Furthermore, the unitary lenses 14 may be either positive lenses (for example, plano-convex and double-convex lenses having a focal point 22 as shown in FIGS. 1 and 2) or negative lenses (for example, plano-concave and double-concave lenses having no real focal point 22 for convergence of the light rays to a point, but instead have a virtual focal point 22' from which the light diverges in the direction of propagation of the light beam 18 as shown in FIG. 3). The size of the unitary lenses 14 is preferably a few millimeters or less; and the focal point 22 (or virtual focal point 22') is preferably from a few microns to several centimeters or more depending on the particular application for the unitary lens semiconductor device 10. The f-number of the unitary lenses 14 (defined herein as the distance from the lens to the focal point divided by the lateral size or diameter of the lens) may be about 1 or larger.

FIG. 2 shows a second example of a unitary lens semiconductor device 10 according to the first embodiment of the present invention. In FIG. 2, the semiconductor layer 16 may comprise a plurality of sub-layers grown one upon another with the composition (i.e. the alloy composition, or the dopant composition, or both) being slightly different from one sub-layer to an adjacent sub-layer, and the sub-layer thicknesses being chosen to provide a desired shape or curvature for the unitary lens 14. For example, an $Al_xGa_{1-x}As$ semiconductor layer 16 may be grown with a plurality of sub-layers, with adjacent sub-layers having different aluminum compositions, x, to provide a plano-convex lens shape as shown in FIG. 2. Alternately, the example of FIG. 2 may be formed with a fixed aluminum composition, x, and adjacent sub-layers having different dopant compositions (i.e. different dopant concentrations and/or dopant types). The thicknesses of the individual sub-layers and the lateral extent of formation of the lower-refractive-index portion 28 in a stepped unitary lens 14 as shown in FIG. 2 may be adjusted to control characteristics of the lens including a focal length (i.e. a distance from the lens to the focal point 22) and a spot size of the light beam 18 at the focal point.

The use of sub-layer thicknesses and lateral extents of the lower-refractive-index portion that are substantially equal to multiples or sub-multiples of an effective wavelength of the light in the lower-refractive-index portion 28 (defined herein as the wavelength of the light beam 18 divided by the refractive index, n, of the lower-refractive-index portion) may be used to form a unitary lens 14 having transmission and focusing characteristics similar to prior art zone-plate or multiple-diffraction-ring lenses. However, the unitary lens 14 according to the present invention may have an advantage over the prior art zone-plate or multiple-diffraction-ring lenses that have corrugated surfaces since the lens 14 may be formed unitarily with a planar outer surface 34. Such a planar outer surface 34 of the unitary lens 14 according to the present invention may have an advantage in allowing the deposition of electrodes or anti-reflection coatings on the unitary-lens semiconductor device 10, or in simplifying attachment to a secondary substrate.

The use of a stepped composition for the semiconductor layer 16 as shown in FIG. 2 may also provide means for controlling the shape or curvature of the unitary lens 14 during formation of the lower-refractive-index portion 28 by a chemical reaction process. For example, with an $Al_xGa_{1-x}As$ semiconductor layer 16, the chemical reaction process for selectively oxidizing (both downward and laterally) each sub-layer having a slightly different aluminum composition, x, or a dopant composition will depend upon the diffusion of water vapor into the sub-layers from the outer surface 34 at the access regions 32. If the aluminum composition, x, or the dopant composition varies in the growth direction to provide a unitary lens 14 as shown in FIG. 2, then the oxidation rate and extent in the vertical (i.e. growth) direction may be smaller than that in the lateral direction, especially for the sub-layers having a high aluminum composition, x, or a high dopant composition (for a p-type dopant) near the outer surface 34.

FIG. 3 shows a third example of a unitary lens semiconductor device 10 according to the first embodiment of the present invention. In this third example, the unitary lens 14 is a negative lens formed by providing a single access region 32 centered about the optical axis 20 or the lens. The access region 32 may be, for example, in the form of a linear trench to form a negative cylindrical lens 14, or in the form of a circular or square shaped well to form a negative spherical lens, or in the form of an elliptical or rectangular well to form a negative anamorphic lens. The lower-refractive-index region 28 is formed by a chemical reactant species that diffuses into the semiconductor layer 16 through the outer surface 34 exposed by the access region 32, thereby reacting with a portion of the semiconductor layer 16 and diffusing inward from the outer surface to convert a portion of the semiconductor layer 16 into a lower-refractive-index material. In the case of an $Al_xGa_{1-x}As$ semiconductor layer 16 the chemical reaction may proceed as described heretofore with water vapor as the chemical reactant species, and the lower-refractive-index material formed by the chemical reaction being an oxide of aluminum. Since the oxide of aluminum formed by the selective oxidation process is substantially transparent to light in the visible and near-infrared regions of the spectrum, the light beam 18 may be transmitted through the lower-refractive-index portion 28 with low loss.

The shape or curvature of the negative unitary lens 14 in the device 10 in the third example of the present invention in may be defined to provide a particular virtual local point 22' by the variation in the composition of the semiconductor layer 16 in the growth direction. By providing, for example, an $Al_xGa_{1-x}As$ semiconductor layer 16 with an aluminum composition, x, continuously increasing in the growth direction and being highest at the outer surface 34, the selective oxidation process for forming the lower-refractive-index portion 28 may be designed to proceed at an increased rate near the outer surface and at a decreased rate away from the outer surface, thereby forming a negative unitary lens 14 having a lateral extent that is larger than a downward extent as shown in FIG. 3.

Figure 4:
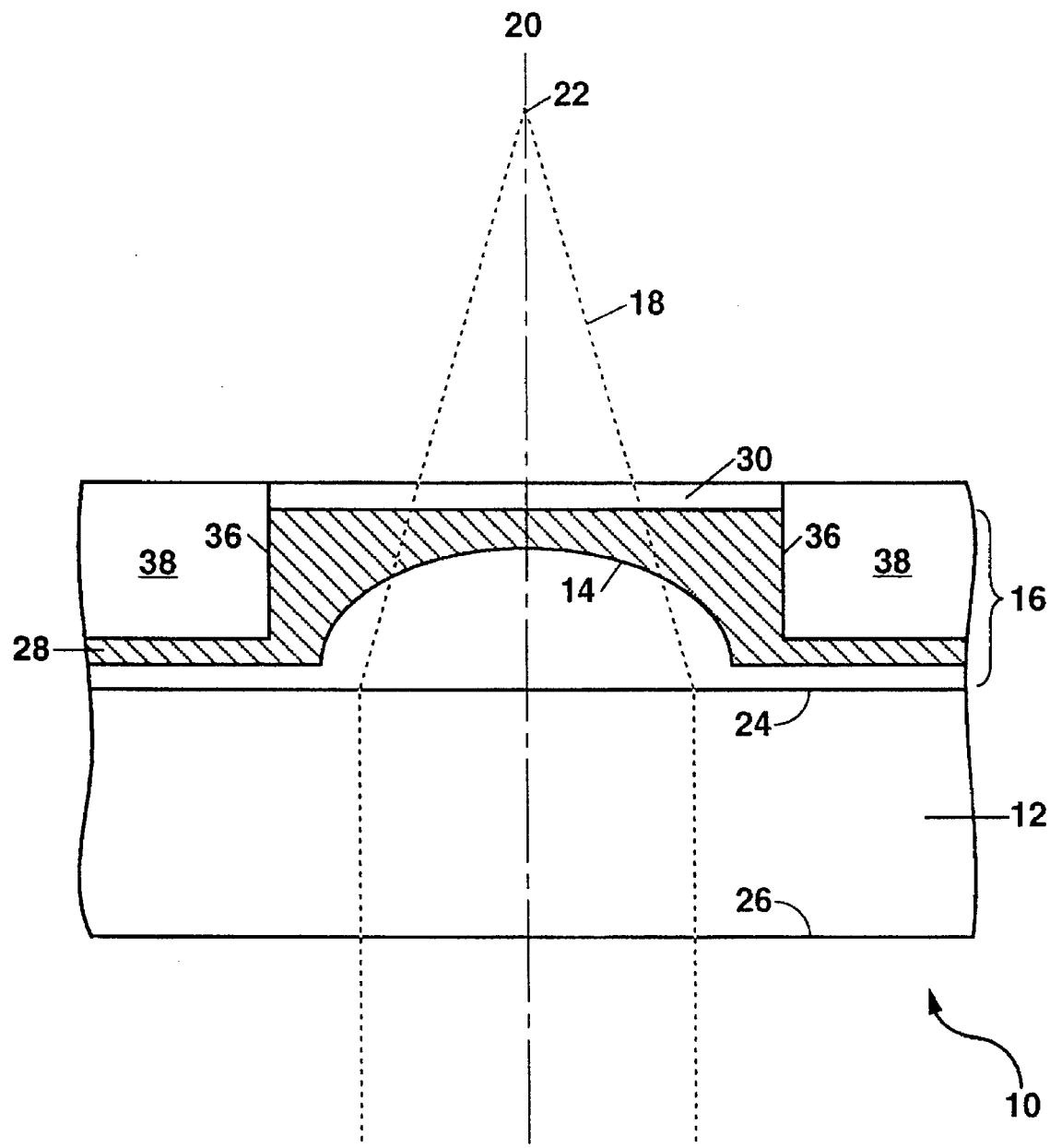
FIG. 4 shows a cross-section representation of a fourth example of a unitary lens semiconductor device according to a second embodiment of the present invention.
Figure 5:
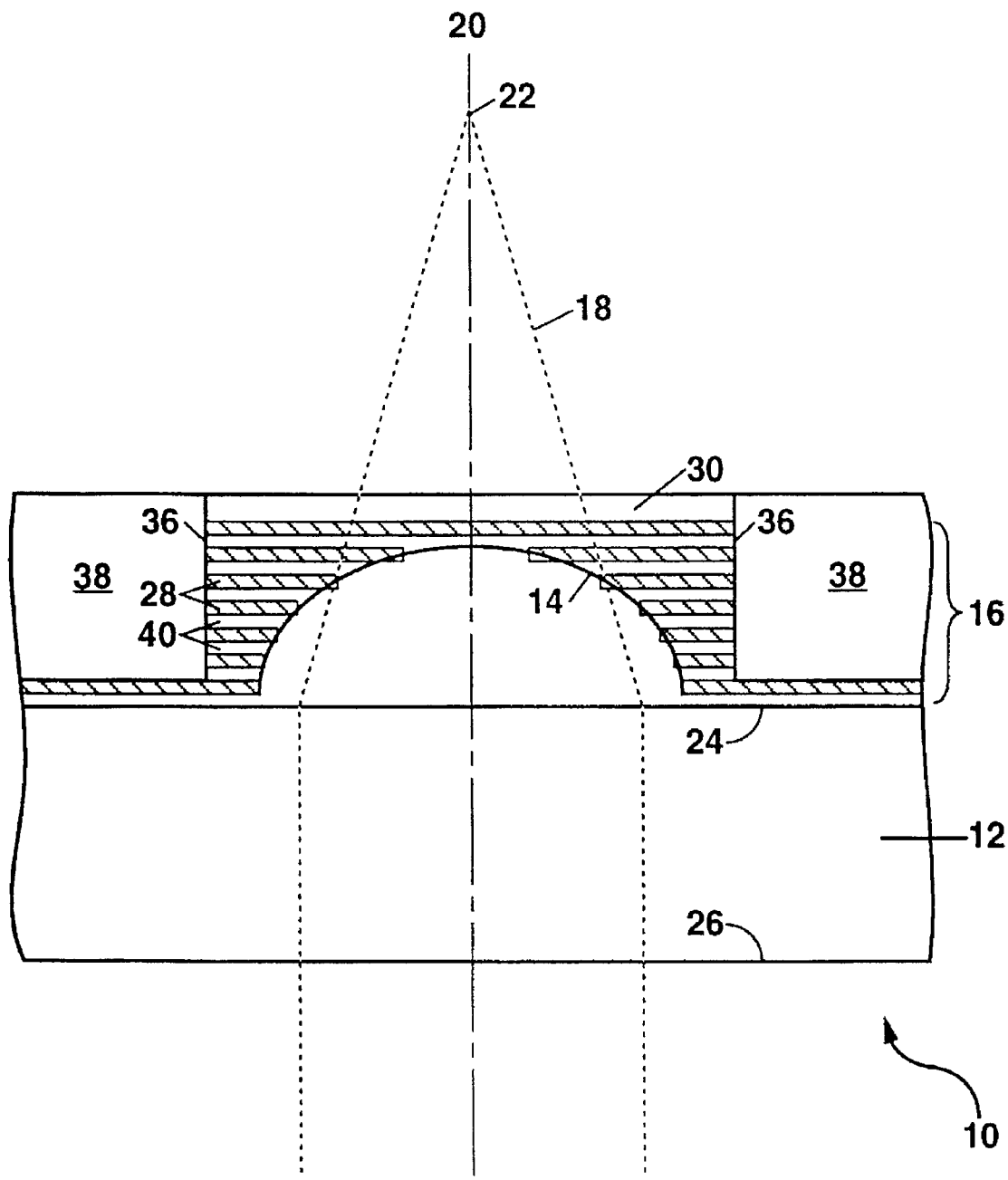
FIG. 5 shows a cross-section representation of a fifth example of a unitary lens semiconductor device according to a second embodiment of the present invention.

According to a second embodiment of the present invention shown in FIGS. 4–5, the unitary lens semiconductor device 10 comprises a substrate 12 supporting at least one unitary lens 14 formed within one or more semiconductor layers 16 in a mesa thereof. The mesa having one or more sidewalls 36 may be formed by etching the semiconductor layer 16 downward at least partially through the lower-refractive-index region 28 as shown in a fourth example of the present invention in FIG. 4. One or more planarization layers 38 may be provided to protect the etched mesa, and to planarize the device 10.

The mesa may be formed by growing or depositing a mask layer 30 above the semiconductor layer 16, lithographically patterning the mask layer, and etching the semiconductor layer downward by a wet or preferably a dry etching process such as reactive ion etching (RIE), reactive ion beam etching (RIBE), or the like. The mask layer may be formed of a semiconductor grown above the semiconductor layer 16 (for example, a GaAs mask layer 30 grown above an $Al_xGa_{1-x}As$ semiconductor layer 16) or the mask layer may be deposited after growth (for example, a silicon nitride, silicon oxide, silicon oxynitride, metal silicide, or refractory metal mask layer 30). After etching the mesa, the mask layer 30 is preferably left in place at least until the lower-refractive-index portion 28 is formed.

In forming the mesa, the etch depth may be measured in-situ by reflectometry to provide a precise control of the etch depth, and to allow the etch process to be stopped after etching downward into the semiconductor layer 16 to a predetermined distance. The etch depth may be, for example, about 5 microns or more. The mesa shape may be circular, square, rectangular, or elliptical when viewed along the optical axis 20, and will depend on the type of unitary lens 14 to be formed (i.e. cylindrical, spherical, or anamorphic). The mesa sidewalls 36 may be straight (i.e. normal to the upper surface 24 of the substrate 12), sloped at an angle to the upper surface 24, or stepped, or otherwise shaped as may be advantageous for shaping the unitary lens 14 to be formed by a chemical reaction process proceeding inward from the mesa sidewalls 36.

The etched region of the semiconductor layer 16 may be cleaned immediately prior to the chemical reaction process by a wet etch (for example, a 10 second etch in a 1:1:10 solution of $H_3PO_4:H_2O_2:H_2O$) to remove surface contamination. This cleaning process may also serve to remove ion etch damage, dry air oxides, and the like that may otherwise affect the chemical reaction process. Immediately after the cleaning process and before the chemical reaction process, the etched region is preferably dried with a stream of air or nitrogen gas.

After the chemical reaction process for formation of the lower-refractive-index portion 28, one or more planarization layers 38 may be deposited, spun, or otherwise formed above the semiconductor layer 16 to protect or passivate the etched mesa and other exposed portions of the semiconductor layer, and to planarize the device 10. The planarization layers 38 are preferably formed from an insulating material such as a polyimide, spin-on-glass, silicon dioxide, silicon nitride, or the like (although a metal planarization layer may be used in some embodiments of the present invention). The planarization layers 38 may be either transmissive or opaque to light over a range of wavelengths of the light beam 18. An opaque planarization layer 38 (such as a metal layer) may have advantages for aligning the light beam 18 along the optical axis 20 of the unitary lens 14, or for reducing light scattering when the light beam 18 has a cross-sectional size larger than the size of the lens 14. An upper metallization 46 may also be used for aperturing the light beam 18 as shown in the examples of the present invention in FIGS. 6–8.

The use of a mesa structure for the unitary lens semiconductor device 10 allows the lower-refractive-index portion 28 to be formed by a chemical reaction process that proceeds in a substantially lateral direction from the mesa sidewalls 36 according to the second embodiment of the present invention; whereas the first embodiment of the present invention provides for both a vertical and a lateral progression of the chemical reaction process. Therefore, the use of a mesa structure may have advantages for providing a more precise and controllable shape for the unitary lens 14.

In addition, a mesa structure allows the semiconductor layer 16 to comprise a plurality of sub-layers with each sub-layer having a semiconductor composition different from the composition of adjacent sub-layers. Furthermore, the semiconductor layer 16 may comprise a plurality of spacer layers 40 (defined herein as a layer 40 that has a refractive index that is higher than that of the lower-refractive-index portion 28) located between a plurality of lower-refractive-index portions 28 formed in the sub-layers as shown in a fifth example of the present invention in FIG. 5. The spacer layers 40 (for example, GaAs spacer layers or $Al_xGa_{1-x}As$ spacer layers with $x \leq 0.3$ in an $Al_xGa_{1-x}As$ semiconductor layer 16) are preferably substantially unaltered during the chemical reaction process, and have a refractive index, n, that is substantially the same as the as-grown layer 40. The spacer layers 40 may thereby provide for a lateral inward progression of the chemical reaction process from the mesa sidewall 36 for formation of the lower-refractive-index portions 28. Such a layered structure for the semiconductor layer 16 has applications for forming light-active unitary lens semiconductor devices 10 according to other embodiments of the present invention as described hereinafter.

According to the third embodiment of the present invention, there is provided a unitary lens semiconductor device 10 having on a substrate 12 a plurality of semiconductor layers 16 forming a light-active region 42 and a lens-forming region 44 proximate to the light-active region. The light-active and lens-forming regions are preferably grown upon the substrate 12 by an epitaxial growth process (MBE, MOCVD, LPE or the like). Upper and lower electrodes (46 and 48, respectively) are provided above and below a semiconductor junction in the light-active region 42 for electrically activating the device 10.

The third embodiment of the present invention provides a method for forming light-active unitary lens semiconductor devices 10 such as light-emitting diodes (LEDs) and photodetectors (PDs). The further addition of an optical resonant cavity formed by a pair of distributed Bragg reflector stack mirrors 62 surrounding the light-active-region 42 according to the third embodiment of the present invention allows the formation of additional types of light-active unitary lens semiconductor devices 10 such as resonant-cavity light emitting diodes (RCLEDs), vertical-cavity surface-emitting lasers (VCSELs), and resonant-cavity photodetectors (RCPDs).

Light-generation unitary lens semiconductor devices 10 (including LEDs, RCLEDs, and VCSELs) and light-detection devices 10 (including PDs and RCPDs) may be formed according to the third embodiment of the present invention. These light-active devices 10 are expected to become increasingly important or many applications including optical interconnection of integrated circuits, optical computing systems, optical recording and readout systems, and telecommunications. Light-active unitary lens semiconductor devices 10 also offer the possibility for wafer scale fabrication and testing, and the possibility of forming one- or two-dimensional arrays having a high packing density for the formation of a plurality of light beam channels for optical communication, optical computing, optical information recording, and optical information readout, and the like. The circular nature of the light output beams 18 that may be generated from and received by these light-active unitary lens semiconductor devices 10 also makes these devices ideally suited for coupling to optical fibers as in optical interconnects for integrated circuits and other applications.

Figure 6:
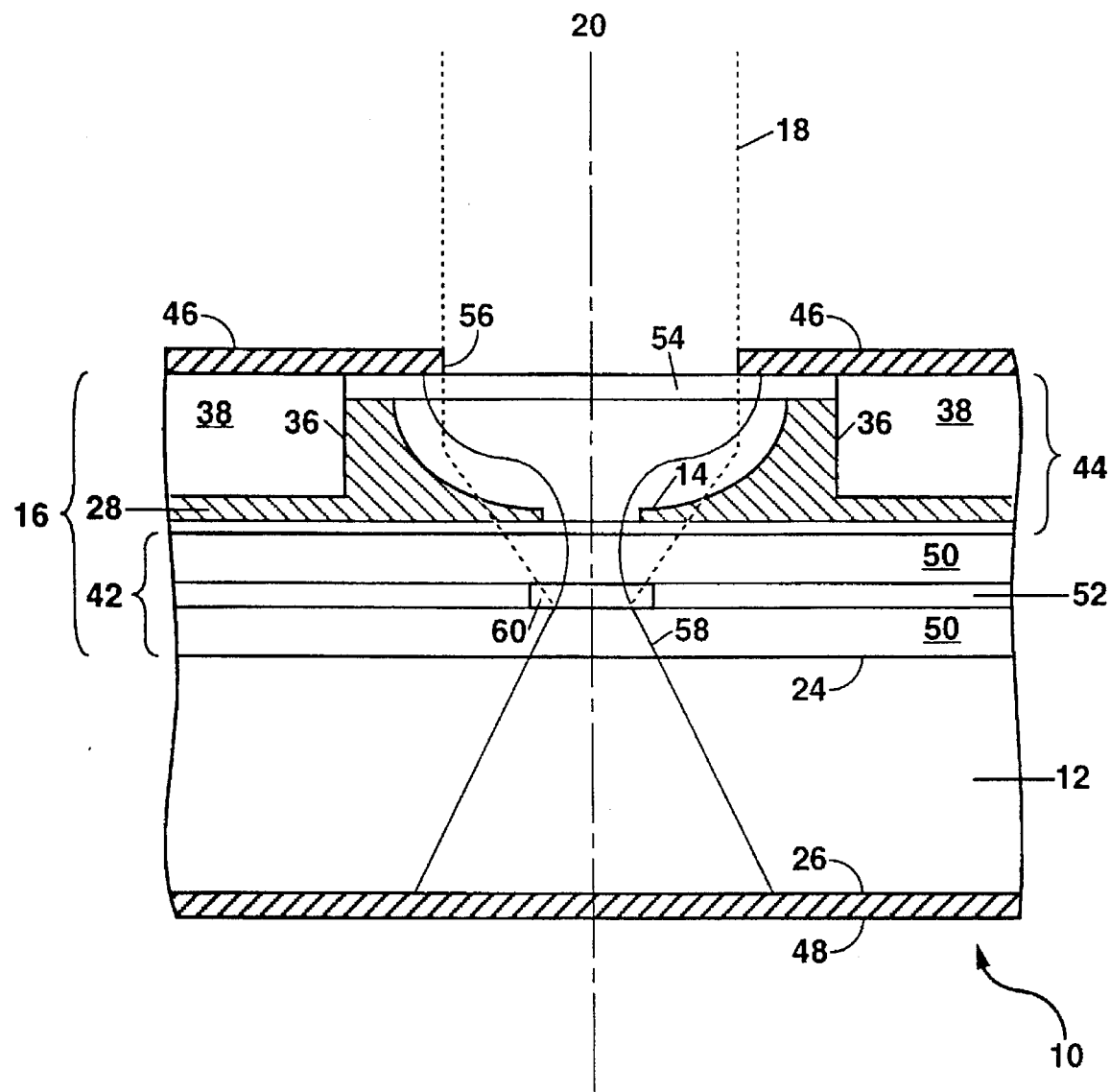
FIG. 6 shows a cross-section representation of a sixth example of a light-active unitary lens semiconductor device according to a third embodiment of the present invention.

FIG. 6 shows a sixth example of the present invention according to the teaching of the third embodiment thereof. In this sixth example, the light-active unitary lens semiconductor device 10 comprises a plurality of semiconductor layers 16 including a light-active region 42 grown on a semiconductor substrate 12 such as GaAs. A semiconductor p-n or p-i-n junction is formed about the light-active region 42; and a unitary lens 14 is formed within a lens-forming region 44 grown above the light-active region 42. Electrodes above and below the semiconductor junction in the light-active region (46 and 48 respectively) may be used to apply a voltage from an electrical source across the semiconductor junction for generating or detecting a light beam 18 therein. If the junction is forward-biased, a LED unitary lens semiconductor device 10 may be formed; whereas if the junction is reverse-biased, a PD device 10 may be formed. The unitary lens 14 in an LED device 10 may act to redirect light rays out from the junction and to reduce an angle of the light rays with respect to the optical axis 20 (i.e. redirecting the light rays more nearly along the optical axis) thereby reducing an internal reflection of the light and improving an efficiency for light generation in the device 10. In other examples according to the third embodiment of the present invention, the unitary lens semiconductor devices 10 may be provided having one or more unitary lenses 14 formed below the light-active region 42, with light beams 18 being transmitted downwards through a transparent substrate 12 and a semi-transparent or patterned lower electrode 48.

Figure 8:
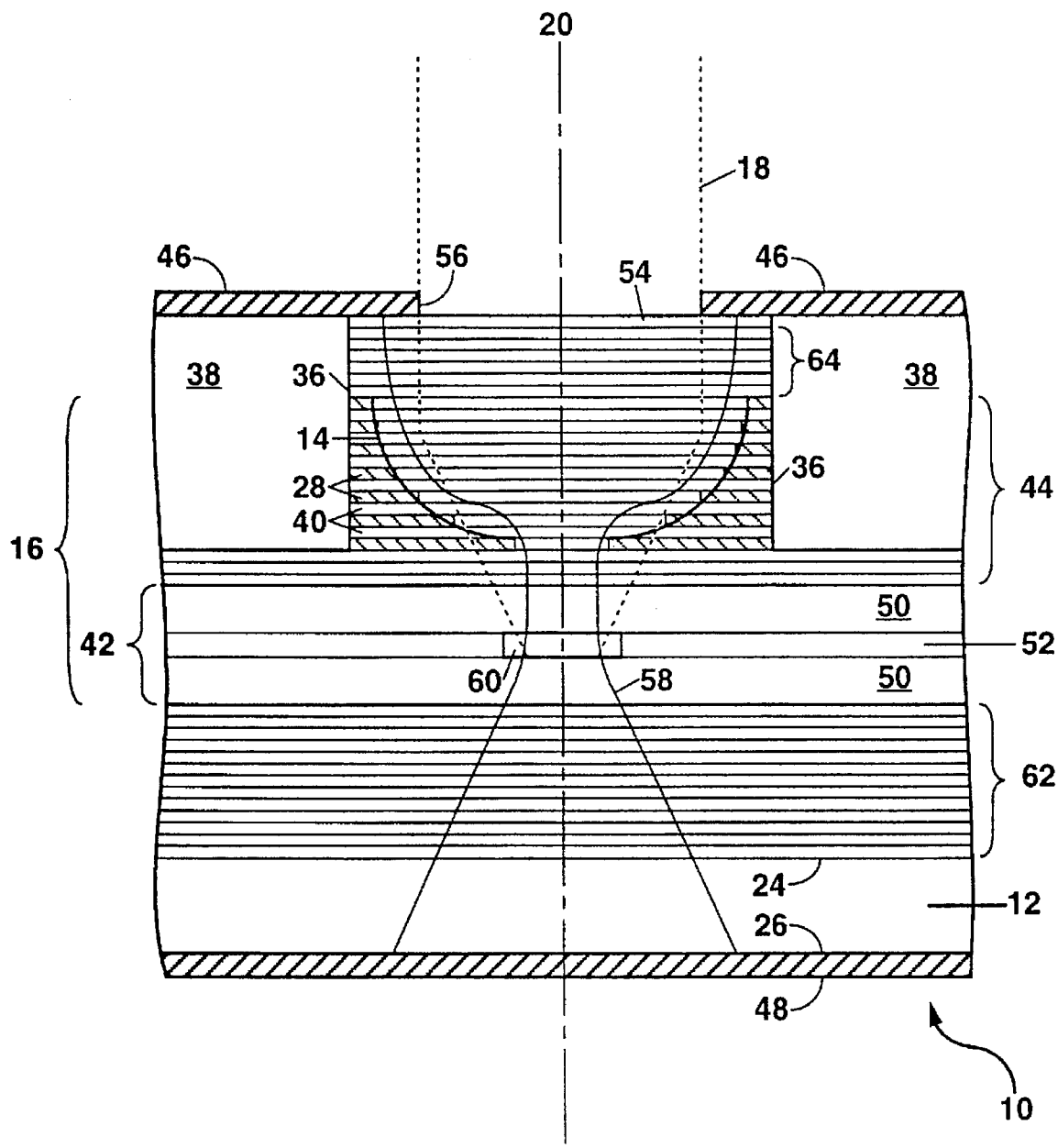
FIG. 8 shows a cross-section representation of an eighth example of a light-active unitary lens semiconductor device according to a third embodiment of the present invention.
Figure 9:
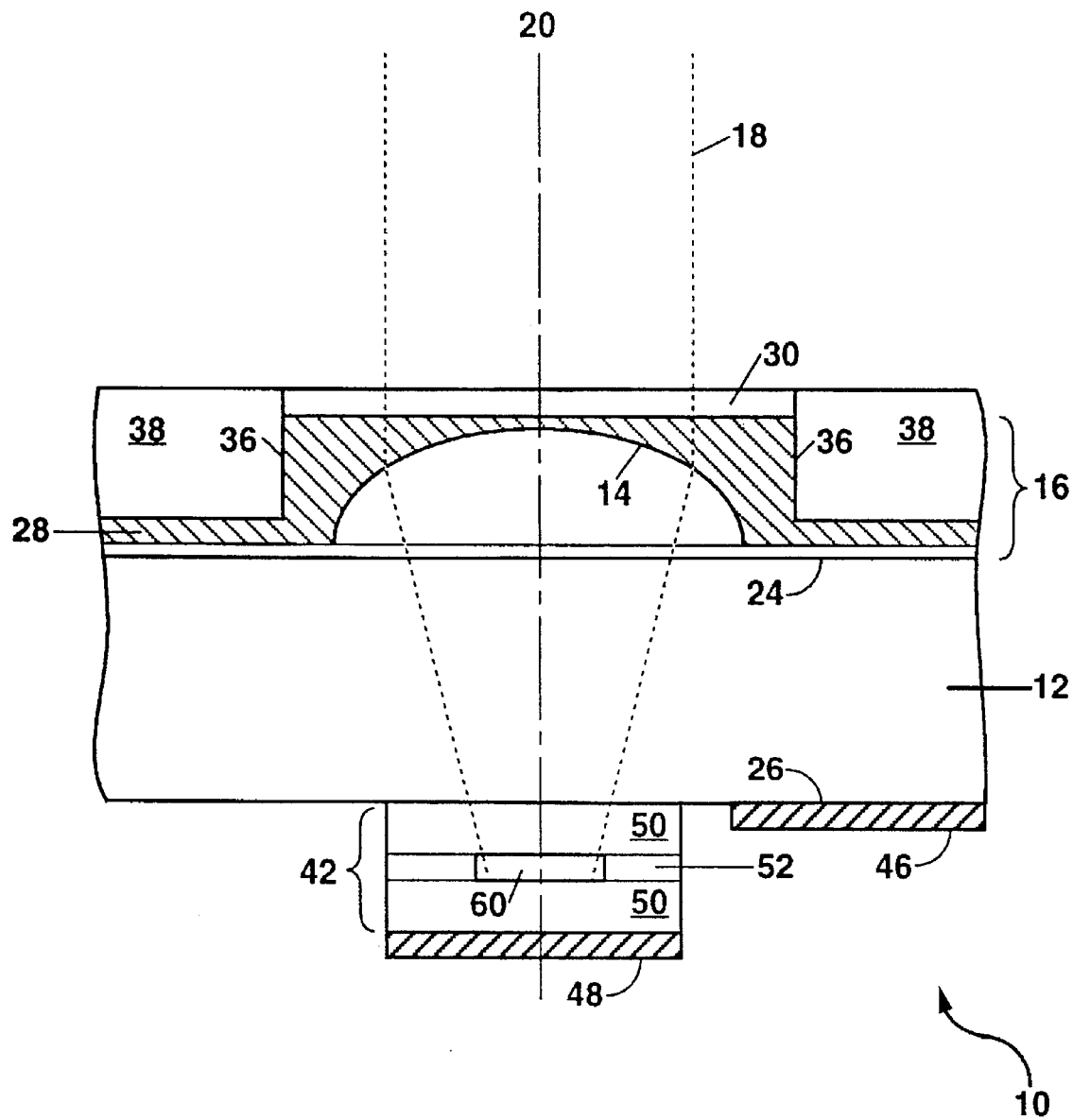
FIG. 9 shows a cross-section representation of a ninth example of a light-active unitary lens semiconductor device according to a third embodiment of the present invention.

In the example of FIG. 6, the substrate 12 may be n-doped with Si to about $1 \times 10^{18}$ cm$^{-3}$. An n-type (about $1 \times 10^{18}$ cm$^{-3}$ Si) GaAs buffer layer may be grown above the substrate 12 before initiating growth of the light-active region 42. The substrate 12 according to the third embodiment of the present invention need not be transparent to the light beam 18 as in the examples of FIGS. 6–8 when the light beam does not propagate downwards through the substrate 12. Thus a substrate 12 may be used for the above examples of the present invention that is substantially opaque or only partially transmissive to the light beam 18. Alternately a transparent substrate 12 may be used for the third embodiment of the present invention. Such a transparent substrate 12 is required when the light beam 18 propagates downward through the substrate as in the example of FIG. 9. The transparent substrate 12 may be electrically conducting to provide allow of an electrical current into the light-active portion 42 as shown in FIG. 9; or the transparent substrate 12 may be electrically insulating if the light-active portion 42 is in direct contact with the upper electrode 46.

A light-active region 42 is grown above the substrate by all epitaxial growth process such as MBE, MOCVD, LPE or the like; with the light-active region 42 having a thickness that is preferably from one to a few wavelengths of the light beam 18 to be generated or detected within the device 10. The light-active region 42 may be formed from a III-V compound semiconductor or a II-VI compound semiconductor, and may comprise a uniform layer composition (i.e. a bulk semiconductor layer) or a pair of cladding layers 50 with an active layer 52 sandwiched therebetween as shown in FIG. 6. The active layer 52 may comprise a bulk semiconductor layer having a thickness of up to 1500 nanometers or more; or the active layer may comprise one or more quantum-well layers (defined herein as semiconductor layers providing a quantum confinement of electrons and holes therein by means of one or more quantum wells, quantum wires, or quantum dots). The active layer 52 (either a bulk layer, or one or more quantum-well layers) may comprise a III-V or II-VI compound semiconductor alloy, with a particular semiconductor alloy selected to provide a specified wavelength range of use of the device 10. III-V compound semiconductor alloys that may be used in forming the active layer 52 include InGaAs, GaAs, AlGaAs, AlGaInP, InGaP, InGaAsP, AlGaAsP, or InAlGaAs.

The cladding layers 50 preferably have an energy bandgap larger than the energy bandgap of the active layer 52. Furthermore, the cladding layers 50 may have a semiconductor alloy composition that is uniform in the growth direction, forming a separate confinement heterostructure (SCH) light-active region 42. Alternately, the semiconductor alloy composition of the cladding layers 50 may be graded in the growth direction (i.e. graded from a higher-bandgap to a lower-bandgap alloy composition for the first-grown cladding layer, and graded from a lower-bandgap alloy to a higher-bandgap composition for the second-grown cladding layer), forming a graded-index separate confinement heterostructure (GRIN-SCH) light-active region 42.

The first-grown cladding layer 50 in the example of FIG. 6 may be n-type doped (to about $5 \times 10^{17}$ cm$^{-3}$ with Si), and the second-grown cladding layer 50 may be doped p-type (to about $5 \times 10^{17}$ cm$^{-3}$ with C) to form a semiconductor junction across the light-active region. The active layer is preferably undoped (i.e. unintentionally doped or intrinsic).

In the example of FIG. 6, a lens-forming region 44 is grown above the light-active region 42, and may be p-doped (to about $10^{18}$ cm$^{-3}$ or higher with C). A heavily-doped GaAs cap layer 54 (p-type doped to about $10^{19}$ cm$^{-3}$ or larger with C) may be grown above the lens-forming region 44 for electrically contacting the upper electrode to form an Ohmic contact.

The lens-forming region 44 may be formed of one or more semiconductor layers 16 having a semiconductor composition varying in the growth direction (i.e. in a direction normal to the upper surface 24 of the substrate 12).The lens-forming region 44 is preferably formed from an aluminum alloy semiconductor including at least one element selected from the group consisting of As, Ga, In, and P. A mesa may be formed extending downward at least partially into the lens-forming region 44 as shown in FIG. 6. The mesa comprises at least one sidewall 36 wherefrom a chemical reaction proceeds to form a lower-refractive-index portion 28 extending laterally inward to an extent varying in the growth direction and thereby forming a unitary lens 14.

In the example of FIG. 6, the lens-forming region 44 may be an $Al_xGa_{1-x}As$ region with an aluminum alloy composition, x, decreasing in the growth direction. The variation in the aluminum alloy composition in the sixth example of the present invention provides a largest inward extent of the lower-refractive-index portion 28 near the light-active region 42, and a smallest inward extent near the cap layer 54. Since the lower-refractive-index portion 28 is preferably also a region of high resistivity or an insulator (an oxide of aluminum in the present example), the unitary lens 14 formed from the lower-refractive-index portion acts to divert a flow of electrical current from the upper electrode 46 into the light-active region 42, thereby defining a current channel 58 through an unaltered (i.e. as-grown) central portion of the lens-forming region 44 as shown in FIG. 6.

The current channel 58 concentrates the flow of the electrical current in the light-active region 42 and defines a light-active area 60 therein that is self-aligned with the unitary lens 14. Such a concentration of the current is advantageous in increasing the density of electrical carriers within the light-active area 60, thereby improving an efficiency for light generation therein.

The location of the largest inward extent of the lower-refractive-index portion 28 near the light-active region 42 may also provide a further advantage of increasing an optical confinement within the light-active area 60 due to a lateral refractive index profile established within the light-active region 42 by the proximate lower-refractive-index portion ($n \approx 1.6$ for an aluminum oxide portion 28) and the unaltered (i.e. as-grown) central portion of the lens-forming region 44 ($n \approx 2.9$ or higher for $Al_xGa_{1-x}As$).

To electrically contact the light-active unitary lens semiconductor device 10 for activation of the light-active region 42, electrodes are preferably deposited above and below the semiconductor junction in the light-active region 42. The electrodes may be deposited above the cap layer 54 and below the substrate 12 as shown in the sixth example of the present invention in FIG. 6. The lower electrode 48 may be a full-surface electrode; whereas the upper electrode is preferably semi-transparent (for example, comprising indium-tin-oxide), or patterned to define a central opening 56 for transmission of the light beam 18. (In other examples of the third embodiment of the present invention, the electrodes may be reversed for transmission of the light beam 18 through the substrate 12.)

The upper electrode 46 in FIG. 6 may be deposited before or after formation of the mesa. If the upper electrode 46 is deposited before the etching step for formation of the mesa, the upper electrode may either be protected by a mask layer 30; or the upper electrode may itself be patterned and form at least a part of the mask layer 30.

In the example of FIG. 6, the upper electrode 46 may be formed by depositing a Ti/Au or a AuBe/Ti/Au metallization above a p-type cap layer 54, and defining the central opening 56 therein by a lithographic masking and lift-off process. Likewise, in the example of FIG. 6, the lower electrode 48 may be formed by depositing a AuGe/Ni/Au full-surface metallization on the lower surface 26 of an n-type substrate 12. After deposition, the electrode metallizations may be annealed, forming Ohmic contacts to the device 10.

The central opening 56 in a patterned upper electrode 46 is generally sized to be at least as large in size as the light-active area 60, but preferably smaller in size than the top of the mesa. In this way, light may be efficiently coupled into or out from the device 10 through the central opening 56 while allowing an electrical current to be efficiently coupled through the cap layer 54 and channeled through the lens-forming region 42 and into the light-active region 42 as shown in FIG. 6.

If the semiconductor junction in the light-active region 42 is forward-biased, light may be generated therein. The upward propagating rays of light generated within the junction are redirected by the unitary lens 14 forming a light beam 18 which is emitted from the device 10 through the central aperture 56. The unitary lens 14 may be shaped for either collimating the light beam 18, or for focusing the light beam at a focal point 22 (for example, to couple the beam into an optical fiber). Alternately, if the semiconductor junction in the light-active region 42 is reverse-biased, a light beam 18 may be received into the junction through the central aperture 56 and detected (including a beam received from an optical fiber).

Figure 7:
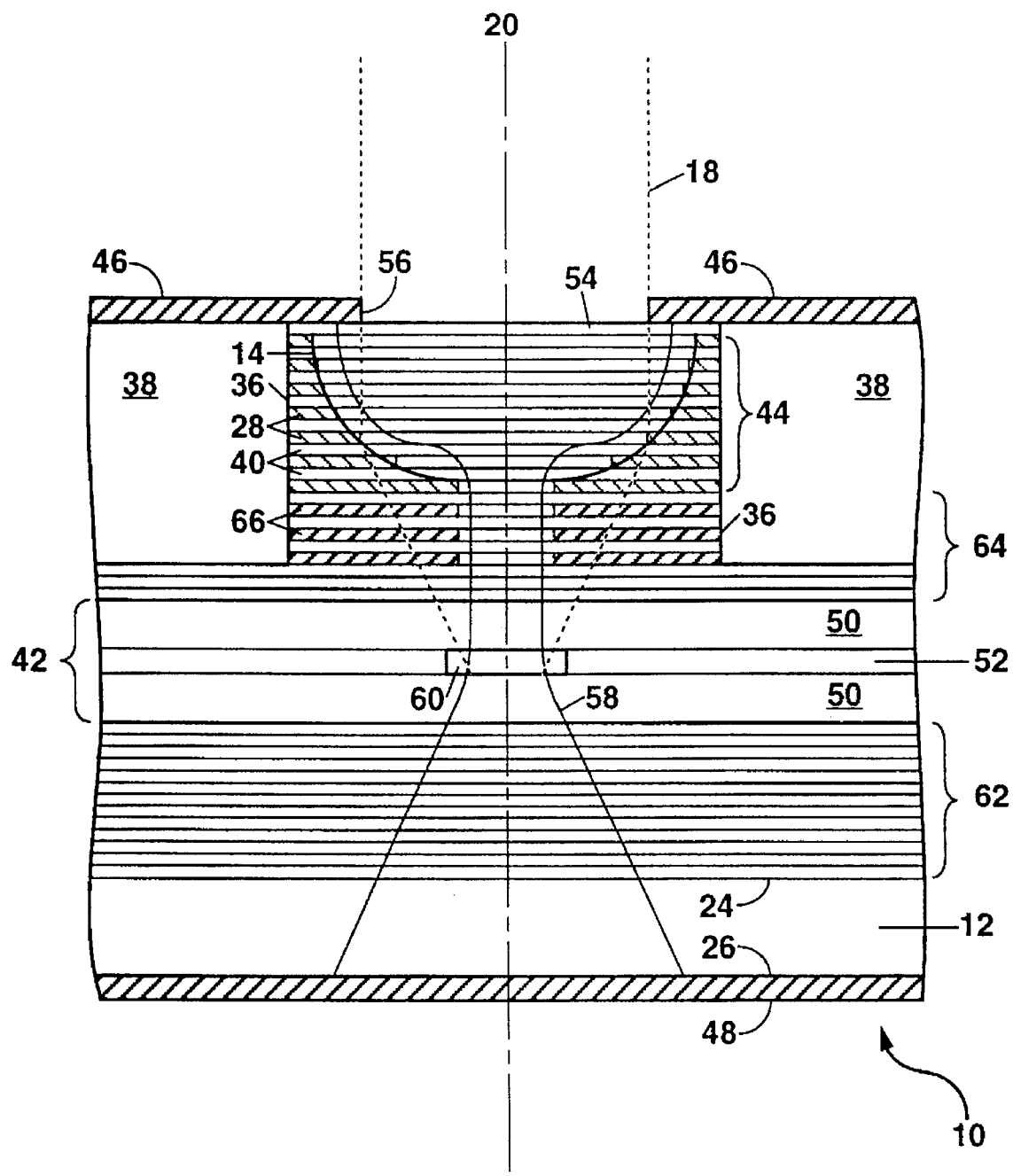
FIG. 7 shows a cross-section representation of a seventh example of a light-active unitary lens semiconductor device according to a third embodiment of the present invention.

FIG. 7 shows a seventh example of the present invention according to the third embodiment thereof. In FIG. 7, a pair of stack mirrors (62 and 64) is provided surrounding the semiconductor junction formed in the light-active region 42, with the stack mirrors forming an optical resonant cavity. This example of the present invention may be used to form light-emitting unitary lens semiconductor devices 10 such as RCLEDs and VCSELs by forward-biasing the semiconductor junction in the light-active region 42, or to form light-detecting unitary lens semiconductor devices 10 such as RCPDs by reverse-biasing the semiconductor junction.

In the example of FIG. 7, the stack mirrors (62 and 64) may have reflectivities of about 90% or higher depending on the particular type resonant-cavity device 10 to be formed and whether the light beam is directed upward through the upper electrode 46, or downward through the substrate 12. In a VCSEL, RCLED, or RCPD device 10 according to the present invention, a lower stack mirror 62 may be grown above a substrate 12 before growth of the light-active region 42. The lower stack mirror 62 preferably has a sufficient number of distributed Bragg reflector mirror periods to provide a reflectivity of up to 99% or higher when the light beam 18 is directed upward through the upper electrode 46. In the stack mirrors (62 and 64), each mirror period comprises a high-bandgap semiconductor layer and a low-bandgap semiconductor layer, with each layer having an effective optical thickness (defined herein as the layer thickness multiplied by the refractive index, n, of the layer) of substantially one-quarter-wavelength of the light beam 18.

In the example of FIG. 7, an upper stack mirror 64 is grown above the light-active region 42, and preferably has a slightly lower reflectivity of about 90–99% to allow the light beam 18 to propagate upward from the light-active region 42 (for a light-generating device 10 such as a RCLED or a VCSEL), or to propagate downward into the light-active region 42 (for a light-detecting device 10 such as a RCPD). The lower and upper stack mirrors (62 and 64, respectively) act in combination to form an optical resonant cavity having a high quality factor, Q. The high-Q resonant cavity in combination with a high-gain light-active region 42 may result in lasing action over an operating current range in the case of a VCSEL device 10 having an upper stack mirror 64 with a reflectivity of about 95–99%. In other embodiments of the present invention where lasing action is undesirable, the cavity Q may be reduced by providing an upper stack mirror 64 with a lower reflectivity of about 90% or less (as may be the case for an RCLED device 10). In a RDPD device 10 according to the present invention, the reflectivity of the upper stack mirror 64 may be about the same as that for an RCLED device 10.

The reflectivities of the lower and upper stack mirrors (62 and 64, respectively) may be defined during epitaxial growth of the device 10 by adjusting the number of mirror periods in each stack mirror, and/or by adjusting the semiconductor alloy compositions of the high-bandgap semiconductor layer and the low-bandgap semiconductor layer forming each mirror period. The reflectivity of the stack mirrors may also be designed to allow the light beam 18 to be transmitted downward through the substrate 12, for example, for forming a bottom-surface-emitting VCSEL or RCLED 10. Such a bottom-surface-emitting device 10 may be advantageous for an increased heat sinking efficiency by attaching the upper electrode 46 to a heat sink.

The optical gain in the device 10 may also be adjusted during the epitaxial growth step by providing either a bulk or a quantum-well active layer 52. The number and location of quantum-wells in the quantum-well active layer 52 may further provide means for increasing the optical gain by maximizing a spatial overlap with an electric field antinode of the light in the resonant cavity.

The lower stack mirror 62 is epitaxially grown on the substrate 12 (by MOCVD, MBE, LPE, or the like) with a first dopant type that is preferably of the same polarity as the substrate 12. The lower stack mirror 62 comprises a plurality of mirror periods forming a distributed Bragg reflector. The mirror periods are preferably formed by alternating the growth of high-bandgap and low-bandgap semiconductor layers. The semiconductor alloy composition, layer thickness, and number of the high-bandgap and low-bandgap semiconductor layers in the lower stack mirror 6 are selected to provide a high reflectivity over a wavelength range of the light beam 18 generated in or received by the device 10, with the wavelength range preferably being matched to a gain spectrum (for a light-generating device 10) or an absorption spectrum (for a light-detecting device 10) of the light-active region 42 at an operating temperature range for the device. For embodiments of the present invention designed for use in the wavelength range from about 600 to about 1000 nanometers, the high-bandgap semiconductor layers are preferably aluminum arsenide (AlAs) or aluminum gallium arsenide (AlGaAs), and the low-bandgap layers are preferably gallium arsenide (GaAs) or AlGaAs with a lower aluminum composition than the high-bandgap layers. The layer thicknesses of the stack mirrors (62 and 64) preferably have an effective optical thickness that is about one-quarter of the wavelength of the light generated or detected by the device 10. Other semiconductor alloy compositions may be used for other wavelength ranges; and the semiconductor alloy compositions may or may not include aluminum therein.

In the example of FIG. 7, the lower stack mirror 62 may be n-type doped with Si (about $2 \times 10^{18}$ cm$^{-3}$) and comprise 38 periods of alternating $Al_{0.96}Ga_{0.04}As$ high-bandgap layers and GaAs low-bandgap layers with layer thicknesses of about 80 and 70 nanometers respectively.

The upper stack mirror 64 is grown above the light-active region 42 as shown in FIG. 7. The design and epitaxial growth of the upper stack mirror 64 is similar to that of the lower stack mirror except for an opposite dopant type for the semiconductor layers. When the lower stack mirror and substrate are n-doped, as in the example of FIG. 7, the upper stack mirror 64 is preferably p-doped (to about $1 \times 10^{18}$ cm$^{-3}$ C in the present example of FIG. 7). Generally, the number of mirror periods in the upper stack mirror is less than that of the lower stack mirror 62 for coupling of the light beam 18 into or out from the device 10 through the upper stack mirror 64. In the present example of FIG. 7, for a lower stack mirror 62 comprising 38 mirror periods, a corresponding upper stack mirror 64 may be grown above the light-active region with the same semiconductor alloy layer compositions and layer thicknesses, but having only about 15 to 25 mirror periods to provide for transmitting light through the upper stack mirror 64. For downward emitting devices 10, the number of periods for the lower and upper stack mirrors (62 and 64, respectively) may be reversed.

A lower few periods of each stack mirror proximate to the light-active region 42 may be grown with a reduced dopant concentration as compared to the remaining mirror periods to reduce an optical loss in the resonant cavity due to dopant impurity absorption and light scattering in the mirrors. In the last-grown few periods of the upper stack mirror 64, the dopant concentration may be increased to about $5 \times 10^{18}$ cm$^{-3}$ or more to facilitate the flow of the electrical current in the current channel 58. (A heavily-doped cap layer 54 may also be provided for forming an electrical contact to the upper electrode 46 as shown in FIGS. 6–8.)

The current channel 58 may be further defined by converting a portion of one or more of the high-bandgap layers of the upper stack mirror 64 into control regions 66 by the same chemical reaction process that forms the lower-refractive-index portion 28 of the lens-forming region 44. For an upper stack mirror 64 comprising high-bandgap layers of $Al_{0.96}Ga_{0.04}$, as in the example of FIG. 7, a selective oxidation process may be used to form one or more control regions 66 having an annular region of a reduced refractive index and increased resistivity therein as shown in FIG. 7. The number and location of the control regions 66 may be determined in part by the etch step for forming the mesa. The semiconductor composition of the upper stack mirror 64 may also be varied in the growth direction to limit the rate and lateral extent of formation of the control regions 66 (including, for example, the use of high-bandgap layers containing no aluminum in the semiconductor alloy and therefore not being chemically reactive to form an oxide of aluminum). The reflectivity of the upper stack mirror 64 in the annular control regions 66 may be affected by a change in the effective optical thickness in these regions 66 due to the change in refractive index therein.

The light-active region 42 and the lens-forming region 44 in this example of the present invention may be formed as described heretofore for the sixth example of the invention in FIG. 6. For the formation of RCLED and RCPD devices 10, a bulk light-active region 42 (i.e. a uniform layer composition for the entire light-active region, or a bulk active layer 52 sandwiched between cladding layers 50) may be preferred; whereas for the formation of a VCSEL device 10, a quantum-well light-active region 42 (i.e. a quantum-well active layer 52 sandwiched between cladding layers 50) may be preferred.

As an example, to form a VCSEL device 10 for light emission near 980 nanometers wavelength, the light-active region 42 may comprise $Al_{0.5}Ga_{0.5}As$ cladding layers 50 surrounding an active layer 52 comprised of three 8-nanometer-thick $In_{0.2}Ga_{0.8}As$ quantum-well layers, with each quantum-well layer being surrounded by 10-nanometer-thick GaAs barrier layers. The thickness of the cladding layers 50 may be selected to provide a one-wavelength-thick light-active region 42 within the optical resonant cavity. The VCSEL device 10 of this example may be grown by MOCVD, with the cladding layers and lower and upper stack mirrors being grown at a temperature of about 700° to 755° C., and the quantum-well and barrier layers being grown at a temperature of about 630° C.

For resonant-cavity light-active devices 10, the light-active region 42 preferably has an effective optical thickness that is from one to a few wavelengths of the light to be generated or detected within the device 10, with the thickness preferably being a multiple of one-half of the wavelength of the light beam 18.

The lens-forming region 44 in the example of FIG. 7 preferably comprises a plurality of spacer layers 40 located between a plurality of lower-refractive-index portions 28, with the effective optical thickness of each layer being substantially one-quarter wavelength of the light beam 18 at least in a central as-grown portion of the lens-forming region 44 that is unaltered by the chemical reaction process that forms the lower-refractive-index portions 28. In this way, the phase of the light beam 18 may be maintained in traversing the lens-forming region 44; and the central as-grown portion of the lens-forming region may further act as a distributed Bragg reflector for providing additional constructive optical feedback into the resonant cavity and increasing the cavity Q. The unitary lens 14 may be formed coextensively with the upper stack mirror 64 if the semiconductor composition and layer thickness of the lens-forming region 44 and the upper stack mirror 64 are substantially the same.

The time required for forming the lower-refractive-index portions 28 and the unitary lens 14 formed thereby may be variable, depending on the type of chemical reaction process used and variables thereof. In the case of a selective oxidation process for forming a lower-refractive-index portion 28 from aluminum alloy semiconductor layers such as $Al_xGa_{1-x}As$ layers, the time for formation of the lower-refractive-index portion depends on the temperature to which the semiconductor substrate or wafer is heated as well as the thickness of the semiconductor layers from which the lower-refractive-index portion is formed and the inward lateral extent from the sidewalls 36 to which the portion 28 is to be formed. In the example of FIG. 7, where the lower-refractive-index portion 28 may have a thickness of about 83 nanometers (i.e. an effective optical thickness of one-quarter wavelength) and he formed from $Al_{0.96}Ga_{0.04}As$, a time period of about 30 to 40 minutes may be required for forming the lower-refractive-index portion 28 to a lateral extent of about 50 microns when the selective oxidation temperature is 450° C. At a lower temperature of 425° C., the same portion 28 may be formed to the same lateral extent in about 5.5 hours. In general, the time required for forming a 50-nanometer-thick lower-refractive-index portion 28 by a selective oxidation process may be from about 30 to 150 minutes or more for an oxidation temperature in the range of about 400° to 450° C. The temperature range over which the selective oxidation process may be used is about 350° to 500° C. for $Al_xGa_{1-x}As$ semiconductor layers, and may be larger or smaller for other aluminum alloy semiconductors including at least one element selected from the group consisting of As, Go, In, and P. The composition and quality of the aluminum oxide formed by the selective oxidation process may also be temperature and composition dependent.

After the chemical reaction process for forming the lower-refractive-index portions 28 is completed, a planarization layer 38 may be deposited, spun onto, or otherwise formed above the light-active region 42 to protect or passivate the etched mesa and exposed semiconductor layers, and to planarize the device 10. The planarization layer in this example of the invention is preferably insulating in nature and may be formed of materials such as polyimides, spin-on-glasses, silicon dioxide, silicon nitride, and the like.

After planarization of the device 10, the upper and lower electrodes (46 and 48, respectively) are preferably deposited, patterned, and annealed to form a patterned upper electrode 46 and a full-surface lower electrode 48 for electrically contacting the unitary lens semiconductor device 10. The device 10 may be mounted on a heat sink with the substrate side of the device positioned in contact with the heat sink and attached thereto. An operating voltage applied across the upper and lower electrodes to forward-bias the semiconductor junction produces a current flow in light-generating devices 10 thereby generating a light beam 18. In light-detecting devices 10, a reverse-bias operating voltage provides for the detection of a light beam 18 received by the device and the generation of a photo-current therein.

In other embodiments of the present invention, a semi-insulating substrate 12 may be provided with the etching step used to form a mesa extending downward to or even into the lower stack mirror 62. For these embodiments of the present invention, a lithographic mask may be used to deposit and pattern the lower electrode 48 directly upon an exposed etched surface of one of the layers forming the lower stack mirror 62 (preferably a GaAs layer having a dopant concentration of about $10^{18}$ $cm^{-3}$ or higher). This top-side contacting process may be preferred for the formation of very-high-speed light-active devices 10 capable of operating at frequencies up to several gigahertz or higher.

FIG. 8 shows an eighth example of the present invention according to the third embodiment thereof. In FIG. 8, the lens-forming region 42 is located within the resonant cavity formed by the lower and upper stack mirrors (62 and 64, respectively). Although the design and formation of the individual elements may be identical to that discussed heretofore for the seventh example in FIG. 7, the placement of the lens-forming region 44 within the optical resonant cavity formed by the stack mirrors may be advantageous. The unitary lens 14 formed within the resonant cavity may influence emission characteristics of the light beam 18 in a light-generating unitary lens semiconductor device 10 such as a RCLED or a VCSEL by providing means for defining a lateral mode for the light. Alternately, a unitary lens 14 within the resonant cavity of a RCPD device 10 may improve the detection characteristics of the light beam 18 by increasing the cavity Q by providing an increased lateral optical confinement of the light within the cavity.

In a VCSEL, for example, a number of lateral modes of the light beam 18 may be generated depending on a lateral size of the optical resonant cavity, and whether the cavity is gain-guided or index-guided. However, the lowest order lateral mode which has a gaussian intensity distribution centered about the optical axis 20 is generally to be preferred. The location of the unitary lens 14 within the resonant cavity may increase the optical gain of the lowest order lateral mode by redirecting the light rays in the cavity in a direction parallel to the optical axis 20, thereby enhancing the lasing in the lowest order lateral mode and suppressing higher-order lateral modes. (According to the third embodiment of the present invention, a unitary lens 14 may be provided above the light-active region 42 as shown in FIGS. 6–8, or below the light-active region; or lens-forming regions 44 may be provided both above and below the light-active region.)

The presence of the lower-refractive-index portions 28 within the optical resonant cavity may also increase the lateral optical confinement of the light within the cavity, index-guiding the light and thereby influencing the number and gain of the lateral modes therein.

Another advantage of placing the lens-forming region 44 within the resonant cavity is that the insulating or high-resistance lower-refractive-index portions 28 may act to channel the electrical current into the light-active region 42. A location of the lower-refractive-index portions 28 closer to the light-active region 42 as in this eighth example of the present invention in FIG. 8 may result in a smaller spreading of the current channel 58 in the light-active region, and the possibility for forming a smaller light-active area 60 with a lateral dimension as small as 1 or 2 microns. (The placement of the lower-refractive-index layers 28 relative the light-active region 42 may be controlled by the etch step for forming the mesa.) Furthermore, an operating voltage of the device 10 may be reduced and an efficiency of the device increased by reducing an electrical resistance in the layers of the device 10 above the light-active region 42 by a larger size of the current channel 58 in the upper stack mirror 64.

FIG. 9 shows a ninth example of the present invention according to the third embodiment thereof. In FIG. 9, one or more unitary lenses 14 are formed in at least one semiconductor layer 16 formed above an upper surface 24 of a transparent substrate 12; and a light-active region 42 is formed below a lower surface 26 of the substrate. The semiconductor layer 16 has a composition varying along the optical axis 20 as described heretofore for forming a lower-refractive-index portion extending downward into the semiconductor layer to an extent varying in at least one direction parallel to the upper surface 24 of the substrate 12 for defining a unitary lens 14. Electrodes are provided above and below a semiconductor junction in the light-active region 42 for electrically activating the light-active region.

In the ninth example of the present invention in FIG. 9, the unitary lens 14 may be formed within the semiconductor layer 16 as heretofore described for either the first or second embodiments of the present invention. The unitary lens 14 may be either a positive lens for focusing the light beam 18 into the light-active area 60 of the light-active region 42; or the unitary lens may be a negative lens for de-focusing the light beam into the light-active area.

The light-active region 42 may either be grown upon the lower surface 26 of a semiconductor substrate 12 or else grown upon a semiconductor growth substrate and attached (either after removal of the growth substrate or while still on the growth substrate) to a transparent substrate 12 formed of a glassy or crystalline material as heretofore described. The form of attachment to a transparent substrate 12 may include an adhesive, solder, or covalent bond.

When the substrate is a doped semiconductor substrate, the upper electrode 46 may be deposited on the lower surface 26 of the substrate 12 as shown in FIG. 9 and patterned. Alternately, when the substrate 12 is an insulator or semi-insulating, the upper electrode 46 may be placed in direct contact with the light-active region 42 opposite the lower electrode 48 which is preferably deposited below the light-active region.

By forward-biasing a semiconductor junction in the light-active region 42 light may be generated therein, forming a light-emitting diode device 10. Alternately, the semiconductor junction may be reverse-biased to form a photodetector for sensing or detecting light. An advantage of forming a unitary lens semiconductor device 10 as in the ninth example of the present invention is that a focal distance from the lens to the semiconductor junction in the light-active region 42 may be increased to about 0.5 millimeters or more (i.e. to about the thickness of the transparent substrate 12). A further advantage is that the unitary lens 14 and the light-active region 42 may be formed separately and assembled on a substrate 12. This may allow the formation of a unitary lens semiconductor device 10 from materials that may be incompatible for epitaxial growth as in the example of FIG. 6.

Embodiments of the present invention have been shown and described as passive unitary lens semiconductor devices for redirecting one or more light beams, and as light-active unitary lens semiconductor devices for generating or detecting one or more light beams. The matter set forth in the foregoing description and accompanying drawings is offered by way of illustration only and not as a limitation. Other applications and variations of the unitary lens semiconductor device and method will become evident to those skilled in the art. The actual scope of the invention is intended to be defined in the following claims when viewed in their proper perspective based on the prior art.

What is claimed is:

1. A unitary lens semiconductor device comprising:

(a) a transparent substrate having at least one semiconductor layer thereon, the semiconductor layer having a composition varying Continuously or in discrete steps in a direction normal to an upper surface of the substrate; and (b) a lower-refractive-index portion formed in the semiconductor layer and extending downward below the upper surface of the semiconductor layer to form a lens having a curved shape defined, at least in part, by the variation in composition of the semiconductor layer for redirecting or focusing light rays.

2. A unitary lens semiconductor device comprising:

(a) a transparent substrate having an upper surface;

(b) at least one semiconductor layer above the substrate, the semiconductor layer having a composition varying continuously or stepwise in a direction normal to the upper surface; and (c) a mesa formed within the semiconductor layer, the mesa having at least one sidewall wherefrom a lower-refractive-index portion of the semiconductor layer extends laterally inward to form a lens having a curved shape defined, at least in part, by the variation in composition of the semiconductor layer.

3. The unitary lens semiconductor device of claim 1 wherein the lens shape is further defined by a patterned mask layer above the lower-refractive-index portion.

4. The unitary lens semiconductor device of claim 1 wherein the semiconductor layer comprises an aluminum alloy, and the lower-refractive-index portion is an oxide of aluminum.

5. The unitary lens semiconductor device of claim 4 wherein the aluminum alloy includes at least one element selected from the group consisting of As, Ga, In, and P.

6. The unitary lens semiconductor device of claim 2 wherein the lens shape is further defined by a shape of the mesa sidewall.

7. The unitary lens semiconductor device of claim 2 wherein the semiconductor layer comprises an aluminum alloy, and the lower-refractive-index portion is an oxide of aluminum.

8. The unitary lens semiconductor device of claim 7 wherein the aluminum alloy includes at least one element selected from the group consisting of As, Ga, In, and P.

9. The unitary lens semiconductor device of claim 2 wherein at least one of the semiconductor layers comprises a plurality of sub-layers, and the semiconductor composition is different in adjacent sub-layers.

10. The unitary lens semiconductor device of claim 9 wherein the sub-layers are separated by spacer layers.

11. A unitary lens semiconductor device comprising:
(a) a semiconductor substrate;
(b) a plurality of semiconductor layers grown above the substrate further comprising a light-active region having a semiconductor junction therein and at least one lens-forming region, the lens-forming region having a semiconductor composition varying continuously or stepwise in the growth direction and including a lower-refractive-index portion having a curved shape to define a unitary lens; and
(c) electrodes above and below the semiconductor junction for electrically activating the light-active region.

12. The unitary lens semiconductor device of claim 11 further comprising a mesa extending downward at least partially into the lens-forming region, the mesa having at least one sidewall wherefrom the lower-refractive-index portion extends laterally inward, the inward lateral extent of the lower-refractive-index portion varying in the growth direction.

13. The unitary lens semiconductor device of claim 12 wherein the inward lateral extent of the lower-refractive-index portion is defined at least in part by the semiconductor composition in the lens-forming region.

14. The unitary lens semiconductor device of claim 11 wherein the lens-forming region comprises an aluminum alloy, and the lower-refractive-index portion is an oxide of aluminum.

15. The unitary lens semiconductor device of claim 14 wherein the aluminum alloy includes at least one element selected from the group consisting of As, Ga, In, and P.

16. The unitary lens semiconductor device of claim 11 wherein the lens-forming region comprises at least two of the plurality of semiconductor layers, with the semiconductor layers of the lens-forming region each having a fixed semiconductor composition therein, and the semiconductor composition varying from one layer to an adjacent layer.

17. The unitary lens semiconductor device of claim 11 wherein one of the electrodes is located on a top surface of the unitary lens, and the unitary lens defines a current channel from the electrode to the light-active region.

18. The unitary lens semiconductor device of claim 17 wherein the current channel defines a light-active area of the light-active region.

19. The unitary lens semiconductor device of claim 11 whereto the semiconductor junction is formed from a pair of cladding layers surrounding an active layer, one of the cladding layers having a p-type dopant, and the other cladding layer having an n-type dopant.

20. The unitary lens semiconductor device of claim 19 wherein the active layer comprises at least one quantum-well layer.

21. The unitary lens semiconductor device of claim 20 wherein the quantum-well layer is comprised of a compound semiconductor selected from the group consisting of III-V compound semiconductors anti II-VI compound semiconductors.

22. The unitary lens semiconductor device of claim 21 wherein the quantum-well layer is comprised of a III-V compound semiconductor selected from the group consisting of InGaAs, GaAs, AlGaAs, AlGaInP, InGaP, InGaAsP, AlGaAsP, and InAlGaAs.

23. The unitary lens semiconductor device of claim 11 wherein the semiconductor junction is forward-biased for generating light therein.

24. The unitary lens semiconductor device of claim 23 wherein the unitary lens collimates the light generated in the semiconductor junction.

25. The unitary lens semiconductor device of claim 23 wherein the unitary lens focuses the light generated in the semiconductor junction at a focal point therefrom.

26. The unitary lens semiconductor device of claim 23 further comprising a pair of stack mirrors surrounding the semiconductor junction forming a resonant cavity.

27. The unitary lens semiconductor device of claim 26 wherein the resonant cavity surrounding the semiconductor junction in combination with the light active region forms a resonant-cavity light-emitting diode.

28. The unitary lens semiconductor device of claim 26 wherein the resonant cavity surrounding the semiconductor junction in combination with the light-active region forms a vertical-cavity surface-emitting laser.

29. The unitary lens semiconductor device or claim 26 wherein the unitary lens is located outside the resonant cavity.

30. The unitary lens semiconductor device of claim 26 wherein the unitary lens is located within the resonant cavity.

31. The unitary lens semiconductor device of claim 30 wherein the unitary lens provides means for defining a lateral mode for the light.

32. The unitary lens semiconductor device of claim 11 wherein the semiconductor junction is reverse-biased for detecting light therein.

33. The unitary lens semiconductor device of claim 32 further comprising a pair of stack mirrors surrounding the active region and forming in combination a resonant-cavity photodetector.

34. A unitary lens semiconductor device comprising:
(a) a transparent substrate having an upper surface and a lower surface;
(b) at least one semiconductor layer above the upper surface of the substrate, the semiconductor layer having a composition varying continuously or stepwise along an optical axis normal to the upper surface and a lower-refractive-index portion extending downward into the semiconductor layer to provide a curved surface that defines at least one unitary lens for redirecting light rays;
(c) a light-active region formed below the lower surface of the substrate and having a semiconductor junction therein, the light-active region having at least one light-active area centered about an optical axis of each unitary lens; and
(d) electrodes above and below the semiconductor junction for electrically activating the light-active region.

35. The unitary lens semiconductor device of claim 34 further comprising at least one mesa extending downward at least partially into the semiconductor layer, each mesa having at least one sidewall wherefrom the lower-refractive-index portion extends laterally inward to further define the unitary lens.

36. The unitary lens semiconductor device of claim 35 wherein the inward lateral extent of the lower-refractive-index portion is defined by the composition of the semiconductor layer.

37. The unitary lens semiconductor device of claim 34 wherein the downward extent of the lower-refractive-index portion is defined by the composition of the semiconductor layer.

38. The unitary lens semiconductor device of claim 34 wherein the semiconductor layer comprises an aluminum alloy, and the lower-refractive-index portion is an oxide of aluminum.

39. The unitary lens semiconductor device of claim 38 wherein the aluminum alloy includes at least one element selected from the group consisting of As, Ga, In, and P.

40. The unitary lens semiconductor device of claim 34 wherein the semiconductor junction is forward-biased for generating light.

41. The unitary lens semiconductor device of claim 34 wherein the semiconductor junction is reverse-biased for detecting light.

42. A unitary lens semiconductor device comprising:
   (a) a transparent substrate having a semiconductor layer thereon; and
   (b) a lens formed in the semiconductor layer below a substantially planar outer surface of the layer and further having a curved shape defined, at least in part, by a continuous or stepwise variation in composition of the layer in a direction normal to the outer surface of the layer.

43. The unitary lens semiconductor device of claim 42 wherein the shape of the lens is further defined by a patterned mask layer provided above the semiconductor layer.

44. The unitary lens semiconductor device of claim 42 wherein the lens is a positive lens.

45. The unitary lens semiconductor device of claim 42 wherein the lens is a negative lens.

46. A unitary lens semiconductor device comprising:
   (a) a transparent substrate; and
   (b) a semiconductor layer disposed on the substrate and including a lower-refractive-index portion therein, the lower-refractive-index portion having an outer surface that is substantially planar and an inner surface that is curved to define a lens within the semiconductor layer.

47. The unitary lens semiconductor device of claim 46 wherein a curvature of the inner surface is continuous.

48. The unitary lens semiconductor device of claim 46 wherein a curvature of the inner surface comprises a plurality of steps.

49. The unitary lens semiconductor device of claim 46 wherein the semiconductor layer comprises an aluminum alloy, and the lower-refractive-index portion comprises an oxide of aluminum.

50. The unitary lens semiconductor device of claim 49 wherein the aluminum alloy includes at least one element selected from the group consisting of As, Ga, In and P.

* * * * *